United States Patent
Jandhyala et al.

(10) Patent No.: US 12,406,114 B2
(45) Date of Patent: Sep. 2, 2025

(54) METHOD TO RECOMMEND DESIGN PRACTICES THAT INCREASE THE PROBABILITY OF MEETING CEMENTING JOB OBJECTIVES

(71) Applicant: Halliburton Energy Services, Inc., Houston, TX (US)

(72) Inventors: Siva Rama Krishna Jandhyala, Houston, TX (US); John Paul Bir Singh, Houston, TX (US); Krishna Babu Yerubandi, Houston, TX (US); Richard Frank Vargo, Jr., Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1046 days.

(21) Appl. No.: 17/409,303

(22) Filed: Aug. 23, 2021

(65) Prior Publication Data

US 2023/0055082 A1    Feb. 23, 2023

(51) Int. Cl.
*G06F 30/27*    (2020.01)

(52) U.S. Cl.
CPC .................................. *G06F 30/27* (2020.01)

(58) Field of Classification Search
CPC ........ G06N 20/00; G06F 30/20; G06F 30/27; E21B 2200/20; E21B 33/14; E21B 2200/22

See application file for complete search history.

(56) References Cited

U.S. PATENT DOCUMENTS

| | | | |
|---|---|---|---|
| 2,237,313 A * | 4/1941 | Prutton | E21B 43/116 |
| | | | 166/291 |
| 6,675,895 B1 | 1/2004 | Shehab et al. | |
| 7,546,884 B2 | 6/2009 | Veeningen et al. | |
| 8,818,756 B1 | 8/2014 | Keenan et al. | |

(Continued)

FOREIGN PATENT DOCUMENTS

| | | |
|---|---|---|
| EP | 2877696 B1 | 10/2017 |
| WO | 2014039052 A1 | 3/2014 |

(Continued)

OTHER PUBLICATIONS

University of Texas at Austin "Casing and Cementing" Third Edition, Unit II, Lesson 4 (Year: 2001).*

(Continued)

*Primary Examiner* — Rehana Perveen
*Assistant Examiner* — Troy A Maust
(74) *Attorney, Agent, or Firm* — Conley Rose, P.C.; Rodney B. Carroll

(57) ABSTRACT

A method of designing a cement pumping procedure of a wellbore isolation barrier includes using a design application that receives customer inputs, which include wellbore data and a job objective. The design application can retrieve a cement pumping procedure from a data source comprising a series of sequential steps to achieve the job objective. The design application can load the customer inputs into the cement pumping procedure, access a database of best practices, calculate a probability score for achieving the job objective based on a model, and recommend modifying one or more steps of the cement pumping procedure with one or more best practices in response to the probability score being below a threshold.

27 Claims, 4 Drawing Sheets

(56) References Cited

U.S. PATENT DOCUMENTS

| | | | |
|---|---|---|---|
| 10,113,408 | B2 | 10/2018 | Pobedinski et al. |
| 10,487,649 | B2 | 11/2019 | Tilke et al. |
| 10,621,500 | B2 | 4/2020 | Dusterhoft et al. |
| 10,858,933 | B2 * | 12/2020 | Bose .................. G01V 1/44 |
| 2008/0149337 | A1 | 6/2008 | Kulakofsky et al. |
| 2014/0067353 | A1 | 3/2014 | Shelley et al. |
| 2016/0061021 | A1 | 3/2016 | Shaposhnikov et al. |
| 2017/0096874 | A1 | 4/2017 | Parsons et al. |
| 2017/0364795 | A1 * | 12/2017 | Anderson .............. G06N 20/10 |
| 2018/0045031 | A1 * | 2/2018 | Shaposhnikov ........ E21B 33/14 |
| 2020/0277848 | A1 * | 9/2020 | Johnston ................ E21B 44/00 |
| 2020/0362664 | A1 * | 11/2020 | Urdaneta .............. E21B 47/005 |
| 2022/0398365 | A1 * | 12/2022 | Kumar .................. G06Q 50/04 |
| 2023/0039147 | A1 * | 2/2023 | Gutarov ................ E21B 47/00 |

FOREIGN PATENT DOCUMENTS

| | | |
|---|---|---|
| WO | 2016134018 A1 | 8/2016 |
| WO | 2017155542 A1 | 9/2017 |

OTHER PUBLICATIONS

Al-Yami et al. "Drilling Expert System for the Optimal Design and Execution of Successful Cementing Practices" 2010 (Year: 2010).*

Prabhu et al. "No Tag to Hard Tag—Case History About Effective Cement Plug Placement Techniques" 2021 (Year: 2021).*

Foreign Communication from Related Application—International Search Report and Written Opinion of the International Searching Authority, International Application No. PCT/US2021/048150, dated May 11, 2022, 9 pages.

Electronic Filing Receipt, Specification and Drawings for International Application No. PCT/US2021/048150, entitled "Method To Recommend Design Practices That Increase the Probability of Meeting Cementing Job Objectives," filed Aug. 30, 2021, 66 pages.

Fuller, George A. et al., "Deepwater Cementing: Key Decision Process and Successful Techniques for Addressing Production Liners," SPE Annual Technical Conference and Exhibition, Oct. 2014, SPE-170666-MS, 13 pages, Society of Petroleum Engineers.

Heu, Tieng Soon et al., "Structured Approach in Qualifying Cement Isolation Through the Use of cementing Scorecard and Post-Job Execution Data," SPE Asia Pacific Oil & Gas Conference and Exhibition, Oct. 2018, SPE-192096-MS, 17 pages, Society of Petroleum Engineers.

"Cementing Shallow Water Flow Zones in Deepwater Wells," Upstream Segment, API Recommended Practice 65, Sep. 2002, First Edition, 8 pages, American Petroleum Institute.

* cited by examiner

METHOD TO RECOMMEND DESIGN PRACTICES THAT INCREASE THE PROBABILITY OF MEETING CEMENTING JOB OBJECTIVES

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In oil and gas wells a primary purpose of a barrier composition such as cement or a sealant is to isolate the formation fluids between zones, also referred to as zonal isolation and zonal isolation barriers. Cement is also used to support the metal casing lining the well, and the cement provides a barrier to prevent the fluids from damaging the casing and to prevent fluid migration along the casing.

Typically, an oil well is drilled to a desired depth with a drill bit and mud fluid system. A metal pipe (e.g., casing, liner, etc.) is lowered into the drilled well to prevent collapse of the drilled formation. Cement is placed between the casing and formation with a primary cementing operation.

A primary cementing operation pumps a cement blend tailored for the environmental conditions of the wellbore. This pumping operation may utilize specialized pumping equipment transported to the drilling rig. The cement is typically pumped down the casing and back up into the annular space between the casing and formation utilizing various downhole equipment such as wipers, darts, float shoes, and casing centralizers.

The cement placed between the casing and formation will isolate the casing from wellbore fluids. The primary cementing operation may isolate one or more zones or formation strata penetrated by the wellbore from undesirable fluid communication there between, for example isolation of a shallow aquifer and one or more production zones downhole. The cement sheath around the casing must isolate the zones to prevent cross zone migration of natural resources.

A successful cementing job may depend on the selection of an optimized blend of cement, the type of pumping equipment, and the choice of downhole equipment for the well location. A guide to selecting the optimum choice of cement, chemicals, and equipment for the location of the cementing job is needed.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
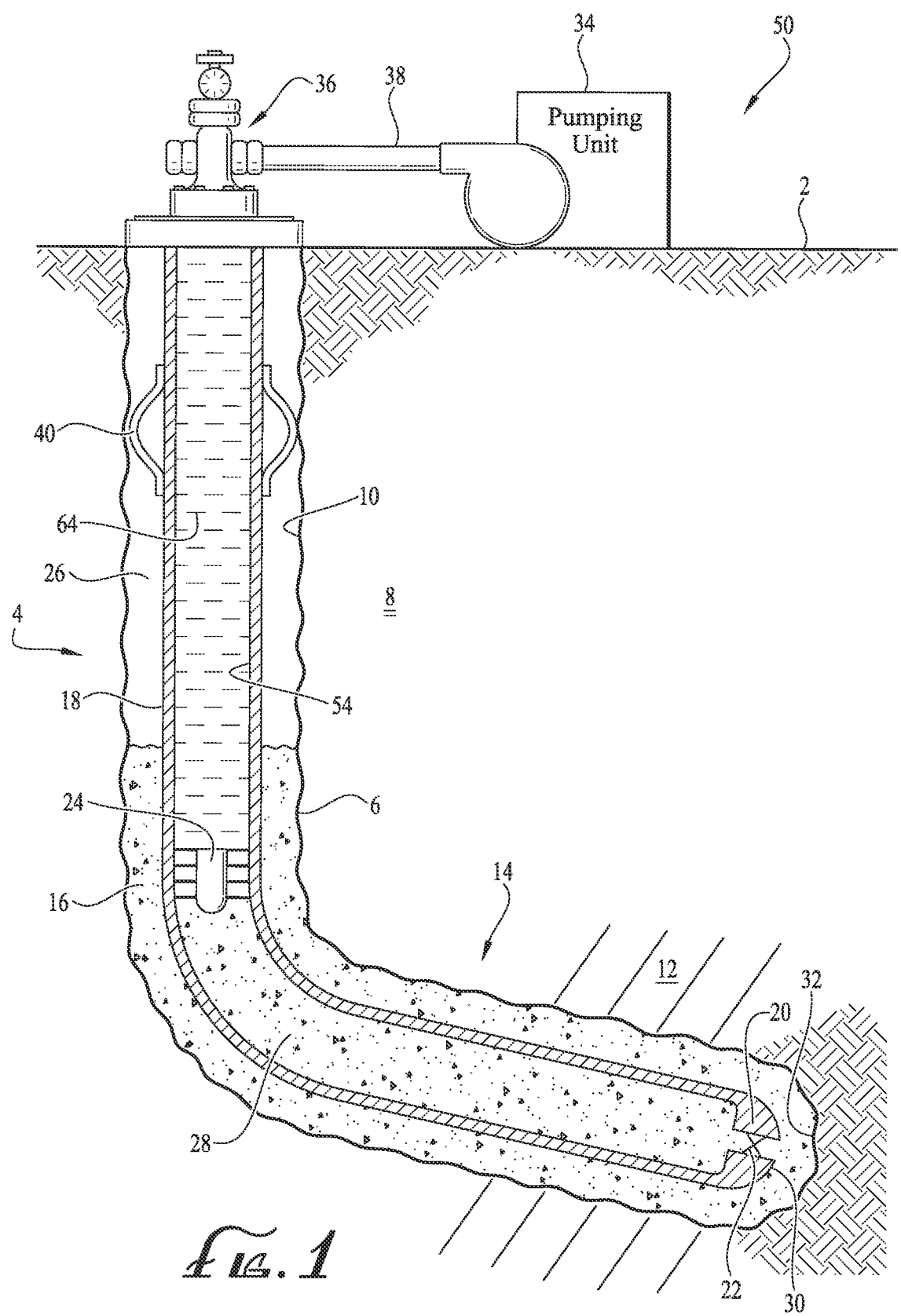
FIG. 1 is a cut-away illustration of an embodiment of a wellbore environment.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

An oil well can be drilled with a drill bit and mud system. A suitable drilling rig can be located on a drilling pad or offshore above the drilling location. As the drill bit penetrates the earth strata, a drilling mud is pumped down a drill string to bring cuttings back to surface. The drilling mud can be water based or oil based with a clay material to increase the weight of the fluid. The drilling mud may also contain various other chemicals for compatibility with the wellbore and to enhance the ability to return cuttings to surface. The weight of the drilling fluids can retain the desired hydrocarbons in the formation until the well is completed. A string of casing, generally defined as individual lengths of pipe threaded together, can be lowered into the drilled wellbore to prevent the wellbore from caving in or collapsing.

During well completion, it is common to introduce a cement slurry, e.g., cement composition, into the annulus formed between the casing and the wellbore. The cement typically used for cementing oil wells can be a Portland cement comprised of a hydraulic cement with a source of free lime and alkali ions, a source of calcium carbonate, a source of calcium sulfate and an organic component. The composition of the cement can be tailored for compatibility with the properties of a subterranean formation or production zone. The cement slurry may also include various additives to modify the hydraulic cement for a given pumping operation. The additives may modify the viscosity of the cement slurry for the pumping operation. One or more additives may control the set time, e.g., accelerate or retard. For example, the cement slurry for an extended wellbore with a high bottom hole temperature may have chemicals added to decrease the pumping pressure, e.g., viscosity modifier, and to retard the set time for the temperature.

A primary cementing operation can include various downhole equipment that can enhance the quality of the cement bond. A float shoe can be coupled to the end of the casing string, also referred to as casing. The float shoe can include one or more flow control devices such as check valves. A stage tool, a casing valve operated by various positioning tools, can be included on the casing string to decrease the pumping pressure required for extended reach wells, e.g., long casing strings. The annular gap between the casing and the wellbore can be maintained by a plurality of casing centralizers. The cement slurry can be separated from the drilling fluids and various other fluids used in the pumping operations, e.g., spacer fluid, by pump down cementing plugs, wiper darts, wiper balls, foam balls, and various other pump down articles. The type of downhole equipment selected can depend on the well type, formation properties, drilling mud properties, wellbore environment, e.g., pressure and temperature, or a combination of factors.

The cement pumping operation can include one or more pumping units. The pumping units can include one or two mixing drums with capacity pumps. The mixing system can include data acquisition system with pressure and density sensors. The cement pumping system can be trailer mounted or skid mounted.

The cement sheath placed in the annulus between the casing and the wellbore can be evaluated with an acoustic logging tool conveyed into the casing by wireline after the primary cementing pumping operation has been completed and the cement has hardened. An acoustic logging can evaluate the cement sheath for quality and consistency. These cement quality indicators may be loaded into a database of historical data of cementing job outcomes.

A cementing job may have one or more objectives to achieve. The engineer designing the job may rely on a set of methodologies to achieve the one or more objectives. The methodologies used by the engineer may be industry standard practices, provided by the service company, learned from training sessions, learned from technical conferences, provided by the district office, provided by the customer, or combination thereof. The engineer may have more than one methodology for a given scenario. In some cases, two or more methodologies may appear to conflict with each other. Which methodology the engineer should follow may be subjective and, for engineers with less experience, may be confusing. A guide for selecting the methodology, e.g., the best practice, for a cementing pumping procedure to obtain cement quality objectives is needed.

One solution to the problem is developing a probability score based on a mathematical model for meeting each objective. In an embodiment, the mathematical model can be built from historical data linking methodologies, e.g., best practices, to completed cementing job outcomes. A database of completed cementing projects, also referred to as cementing jobs, that links the job objectives with a score for the job objective outcomes can be maintained. The methodology that provides the best results for a job objective can be called a best practice. These best practices may be determined by industry practices, field experience, customer guidance, or combination thereof. The best practices, e.g., methodology, utilized for each job objective can be correlated with the score for the job objective outcomes. A mathematical relationship between the best practices and the job outcomes can be extracted, filtered, and regressed. Each new cementing job with the job objectives and related best practices can be added to the database before the cementing operation. The job objective outcomes can be added to the database as the outcomes are received and scored. The database can be updated as new information, e.g., a job objective outcome, is received or if the outcome changes.

Another solution to the problem is applying a design process based on the mathematical model for meeting each job objective or stage objective. In an embodiment, a design process for designing a cement pumping procedure can determine a probability score for meeting the job objective. The design process can apply a probability score, from the mathematical model, for each stage objective or job objective. The probability score can change as best practices are added or taken away from the cement pumping procedure. The design process can identify and recommend one or more best practices to the engineer to improve the predicted outcome of a cementing job. The probability score for meeting each stage objective or job objective changes as the engineer modifies the job design.

Disclosed herein is a method of designing a cement pumping procedure based on a mathematical model. The probability of achieving each job objective can be predicted by the mathematical model. The design method can recommend best practices to increase the probability of meeting the job objectives.

Turning now to FIG. 1, illustrated is an embodiment of a well environment 50 utilizing a cement pumping procedure determined by the design process. The wellbore 6 can be drilled into the subterranean formation 8 using any suitable drilling technique and can extend in a substantially vertical direction away from the earth's surface. The wellbore 6 can be generally cylindrical in shape with an inner bore 10. At some point in the wellbore 6, the vertical portion 4 of the wellbore 6 can transition into a substantially horizontal portion 14. The wellbore 6 can be drilled through the subterranean formation 8 to a hydrocarbon bearing formation 12. Perforations made during the completion process that penetrate the casing 18 and hydrocarbon bearing formation 12 can enable the fluid in the hydrocarbon bearing formation 12 to enter the casing 18.

In an embodiment, the wellbore 6 can be completed with a cementing process that follows a cementing pumping procedure to place cement between the casing string 18 and the wellbore 6. Cement pumping equipment 34, also called cementing equipment, can be fluidly connected to a wellhead 36 by a supply line 38. The wellhead 36 can be any type of pressure containment equipment connected to the top of the casing string 18, such as a surface tree, production tree, subsea tree, lubricator connector, blowout preventer, or combination thereof. The wellhead 36 can anchor the casing string 18 at surface 2. The wellhead 36 can include one or more valves to direct the fluid flow from the wellbore and one or more sensors that gather pressure, temperature, and/or flowrate data. The service personnel can follow a cement pumping procedure with multiple sequential steps to place cement into the annular space 26. The cement pumping procedure can include steps of pumping a spacer fluid to separate the drilling fluid, e.g., drilling mud, from the cement slurry. Pumping a cementing wiper plug 24, or similar downhole equipment, to physically separate the drilling fluid from the cement slurry 28. The cement wiper plug 24 comprises a plurality of flexible fins, or wipers, that sealingly engage the inner surface 54 of the casing 18 with a sliding fit. The service personnel can blend a volume of cement slurry tailored for the wellbore. The cement pumping equipment 34 can pump a predetermined volume of cement slurry 28 though the supply line 38, through the wellhead 36, and into the casing 18. A cementing wiper plug 24 can be released by plug drop assembly (not shown) after the end of the predetermined volume of cement slurry 28 has been pumped into the casing 18. A volume of spacer fluid 64 or other type of completion fluid can be pumped after the cementing wiper plug 24 to displace the cementing wiper plug 24 down the casing string 18. The cementing wiper plug 24 can push the cement slurry 28 out the float shoe 20 (or other suitable primary cementing equipment), and into the annular space 26 between the casing string 18 and the wellbore 6. In other embodiments, however, the casing string 18 may be omitted from all or a portion of the wellbore 6 and the principles of the present disclosure can equally apply to an "open-hole" environment. In still other embodiments, however, the primary cementing equipment, e.g., float shoe 20, at the end of the casing string 18 can be drilled out and a liner can be added to extend the length of the wellbore.

The cement 16 can be Portland cement or a blend of Portland cement with various additives to tailor the cement for the wellbore environment. For example, retarders or accelerators can be added to the cement slurry to slow down or speed up the curing process. In some embodiments, the cement 16 can be a polymer designed for high temperatures. In some embodiments, the cement 16 can have additives such as expandable elastomer particles.

The cement 16 placed in the annular space 26 between the casing 18 and the wellbore 6 can cure (harden) to form a wellbore isolation barrier, also referred to as a cement sheath. The term wellbore isolation barrier may refer to Portland cement or a blend of Portland cement that has cured or hardened. The term wellbore isolation barrier can refer to a polymer that has cured or hardened.

The cementing operation can have a plurality of stage objectives, also called performance objectives. The plurality of stage objectives can combine into a job objective. A cementing operation can have a single job objective without one or more stage objectives. The stage objectives can be cement performance, equipment performance, and combination thereof. The job objective can be the customer requirements, wellbore requirements, and combination thereof.

A job objective can be provided by the customer, the service company, or an industry standard. Typically, job objectives are evaluated after the cement slurry has been placed into the annular space 26 and cured to form the cement sheath, e.g., cement 16. Some examples of job objectives are a shoe test, zonal isolation, Top of Cement (TOC), and Kick off Plug (KOP). The shoe test can be performed with a Leak Off Test (LOT) or a Formation Integrity Test (FIT). The FIT test can be performed by the service personnel at surface 2 by applying pressure to the inside of the casing 18 to a predetermined design pressure that doesn't fracture the cement. The FIT test can test the cement bond between the float shoe 20 and the wellbore 6. The shoe test can also be performed with a LOT test. The LOT test fractures the cement bond and the formation. The service personnel at surface 2 can apply pressure to the inside of the casing 18 until both the cement 16 and the formation 12 fractures. The pressure that the drilling fluid, or other completion fluid, is pumped into the formation 12 can be referred to as the leak off pressure. The successful completion of the FIT test or LOT test can be the job objective.

Figure 2:
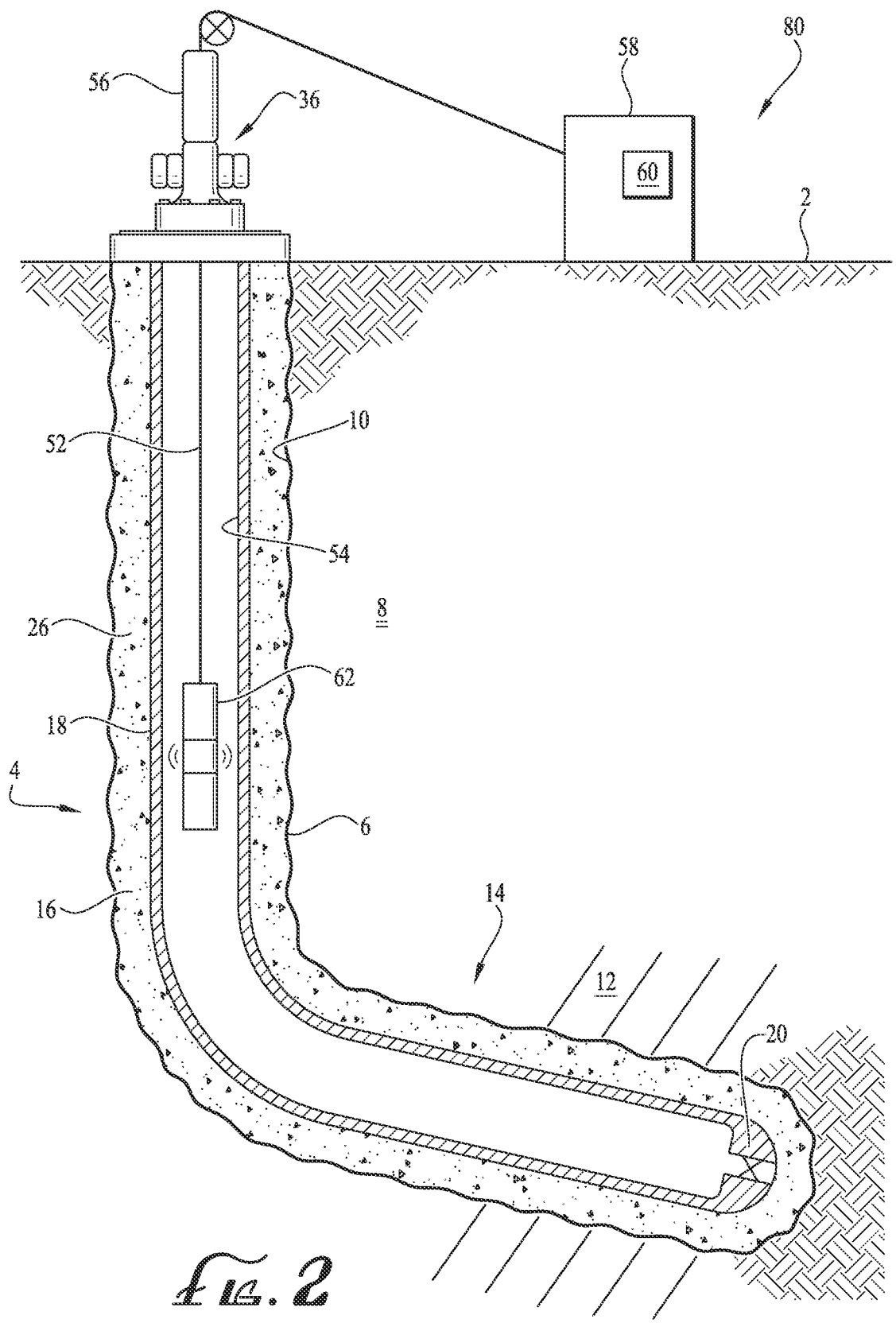
FIG. 2 is a cut-away illustration of an embodiment of a wellbore evaluation system.

Other job objectives may require additional downhole tools and services to evaluate. Turning now to FIG. 2, a wellbore evaluation environment 80 for evaluating cement behind the casing is illustrated. An acoustic logging tool 62 can be conveyed into the casing 18 by a work string 52. The work string 52 can be a wireline cable, coil tubing, or a tubing string with a conductor. The conductor can electrically couple the acoustic logging tool 62 to surface equipment 58 via the work string 52. A lubricator 56 can couple to the wellhead 36 to sealingly engage the work string 52 and isolate the wellbore pressure. The acoustic logging tool 62 can be, for example, a cement bond log tool (CBL), an ultra-sonic imager (USI), or other type of cement scanner tool. The acoustic logging tool may obtain measurements of amplitude and variable density from sonic acoustic waves, acoustic impedance from ultrasonic waves, or other types of measurements from acoustic echoes. These measurements can be transmitted to an evaluation application executing on a computer system 60 for analysis. Cement quality indicators may be derived from one or more of these measurements. For example, a cement bond log indicating the quality and consistency of the cement between the casing 18 and the wellbore 6 can be produced. A successful cement bond log can be one of the stage objectives or can be the job objective.

The TOC can be one of the stage objectives or the job objective. The acoustic logging tool can determine the location of the TOC. TOC typically refers to the highest depth of the cement 16 within the annular space 26. For example, some subterranean formations 8 may include an aquifer or other source of water. One of the stage objectives can be for the TOC to be a predetermined distance above the aquifer. In another scenario, a stage objective or job objective can be for TOC to cover a liner top, e.g., a liner hanger and liner seal. In still another scenario, the TOC can be a stage objective or a job objective for the TOC to seal at the surface 2. The location of the TOC can be one of the stage objectives or can be the job objective.

A KOP can be one of the stage objectives or a job objective. A KOP can be a volume of cement placed in an openhole environment to drill a lateral wellbore. A directional drilling assembly can drill a pilot hole. The KOP can be set below and adjacent to the pilot hole to stabilize the inner bore 10 of the wellbore 6. In some cases, the KOP can be placed on top of a downhole tool such as a bridge plug. In other cases, the KOP can be placed on top of a chemical pill. A successful KOP allows the directional drilling assembly to drill the lateral wellbore. The KOP can be one of the stage objectives or can be the job objective.

Figure 3:
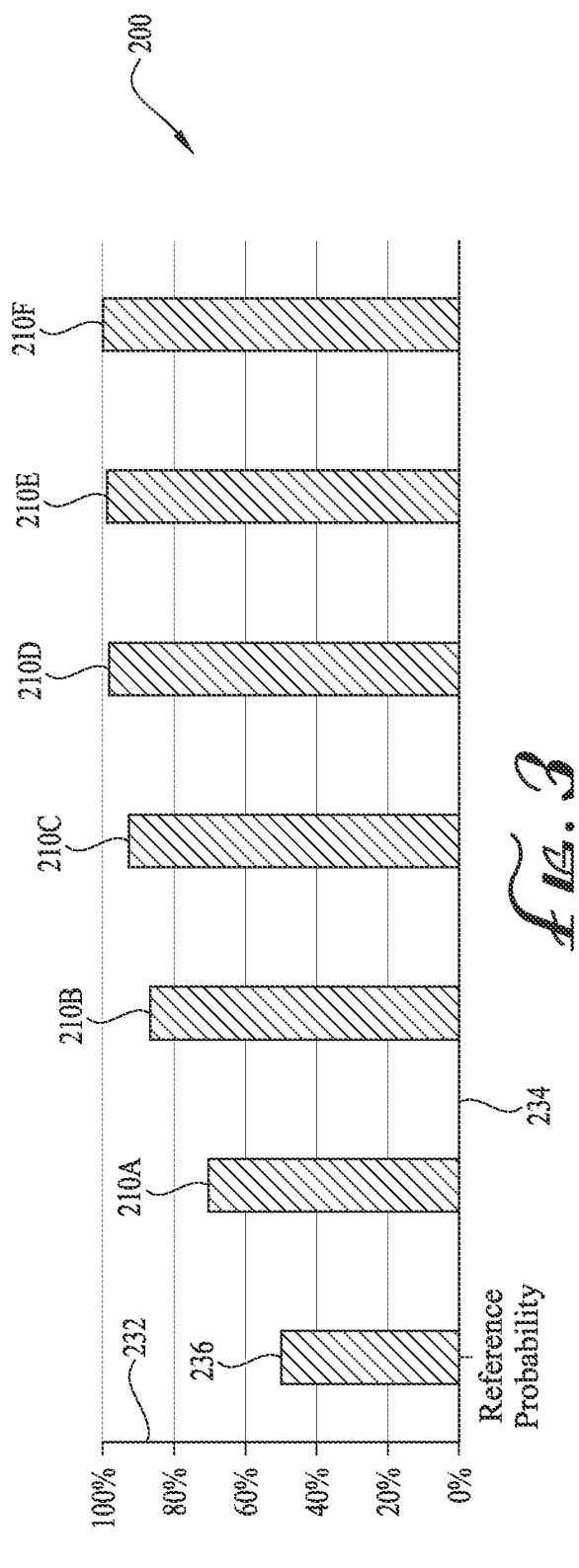
FIG. 3 is an illustration of an overall probability of meeting a job objective according to an embodiment of the disclosure.

The design process can apply a probability score to meeting a stage objective or job objective based on adding or removing best practices to the cementing procedure. Turning now to FIG. 3, a job probability 200 of meeting an objective is illustrated. A job probability 200 can be illustrated with a graph. The job probability 200 can be for a stage objective or a job objective. The chart includes a probability axis 232 with units of percentage and a series of steps for the stage objective or job objective are represented on the axis 234. The probability score 232 of a cement pumping procedure achieving a stage objective or job objective can be obtained from the probability axis 232. The design process may be a design application executing on a computer system. The design process may assign a reference probability 236 to the job probability 200. The reference probability 236 is illustrated as 50% as an example. It is understood that the design process may assign a reference probability 236 of any percentage (e.g., 0%, 10%, 20%). The reference probability 236 may be based on historical data. The job probability 200 changes for each best practice 210 added to the stage objective or job objective. A best practice 210 may be qualitative, e.g., a yes or no. A best practice 210 may be a quantitative, e.g., a volume of fluid. For example, in one scenario, a best practice 210 may be the qualitative as in the use of modeling casing stretch. In another scenario, a best practice 210 may be the quantitative as in the addition of specified volume of a fluid treatment. The best practice 210A may change the probability from 50%, e.g., the reference probability 236, to 70%. The best practice 210B, modeling casing stretch from applied pressure, may change the probability from 65% to 85%. The best practice 210C, removing eccentricity with casing centralizers, may change the probability from 85% to 91%. The best practice 210D, a predetermined amount of time for contact with spacer fluid, may change the probability from 91% to 97%. The best practice 210E, a field specific blend for spacer fluid composition, may change the probability from 97% to 98%. The best practice 210F, a field specific blend for cement composition, may change the probability from 98% to 99%. The term cement blend may refer to a cement composition of dry materials with one or more additives. The design process may recommend one or more best practices 210A-F. For example, the design process may recommend best practice 210B, modeling casing stretch, to the engineer to increase the job probability 200.

The design process, e.g., the design application, may recommend one or more best practices to stage objectives. Some examples of stage objectives are cementing tool tests, downhole tool placement, and chemical treatments. For example, at the beginning of the job, the cement pumping procedure may list testing the check valve 22 in the float shoe 20 as one of the stage objectives. The check valve 22 in the float shoe 20 can be flow tested and pressure tested at surface 2 by sealing on the outside of the casing 18 by the annular seals on a blow out preventer (BOP) and flowing through the casing with drilling fluid or similar fluid. The check valve 22 can open to allow a predetermine flowrate to pass. Annular pressure can be applied below the float shoe 20 to test the check valve 22 is holding. The design process can recommend one or more best practices 210A-Z for testing the float shoe 20. For example, the flowrate to pump through the float shoe 20 may be a best practice 210A-Z. Applying annular pressure to the float shoe 20 while sealed in the BOP may be a best practice 201A-Z. The surface test of the one or more check valves 22 on the float shoe 20 can be a stage objective.

Another stage objective can be the placement of the bottom surface 30 of the float shoe 20 relative to the toe 32, e.g., the bottom, of the wellbore 6. The casing string 18 can be run to bottom, e.g., lowered into the wellbore 6, without the bottom surface 30 of the float shoe 20 contacting the toe 32 of the wellbore 6. The design process may recommend a best practice 210A-Z of modeling the casing stretch with applied internal pressure from the pumping process. The modeling of the casing stretch can be a qualitative type of best practice 210A-Z. The proper placement of the casing string 18 within the wellbore 6 can be a stage objective.

Another stage objective can be the use of centralizers 40, as shown in FIG. 1, to centralize the casing 18 within the annular space 26 of the wellbore 6. Centralizers 40 can be bow spring type, solid type, placed over couplings at casing joints, attached mid-joint of casing 18. Centralizers 40 can orient the casing string 18 to the middle of the annular space 26 to prevent the casing string 18 from touching the inner bore 10 of the wellbore 6. Eccentric placement of the casing string 18, e.g., touching the wellbore 6, can cause the cement sheath to be too thin and prevent the desired zonal isolation. The use of centralizers can be a qualitative type of best practice 210A-Z. The number of centralizers used or the spacing between centralizers can be a quantitative type of best practice 210A-Z. Preventing the casing string from an eccentric orientation within the annular space 26 can be a stage objective.

Figure 4:
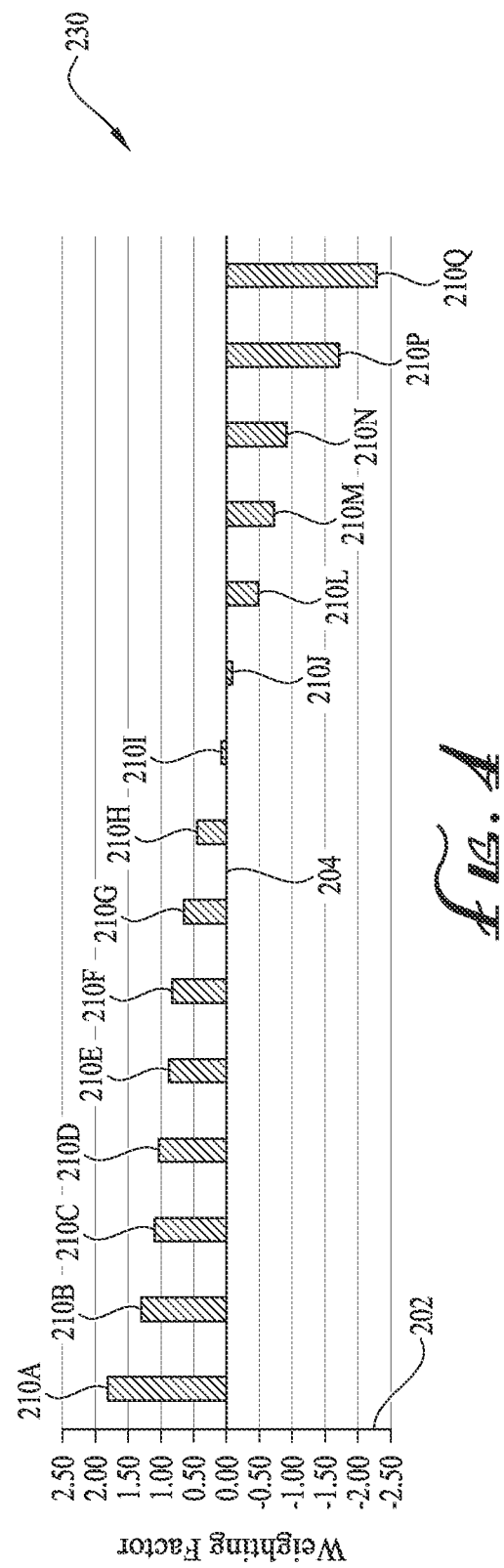
FIG. 4 is an illustration of a series of weighting factors for best practices according to an embodiment of the disclosure.

The best practices 210A-Z can have a weighting factor assigned as some best practices 210A-Z have a larger effect on the outcome of the stage objective and/or job objective. Turning now to FIG. 4, an illustration of a series of weighting factors for best practices for job objective 230 is illustrated. The chart includes an axis for the weighting factor 202. The series of best practices for representative job objective 230 are represented on axis 204. A best practice 210A for the representative job objective 230 can have a weighting factor 202A of 1.75. It is understood that the best practices 210A-Z for representative job objective 230 can be different from the best practice 210A illustrated in FIG. 3. The best practices for each stage objective and job objective can be different, therefore best practice 210A-Z are unique in every example. A best practice 210B for the representative job objective 230 can have a weighting factor 202B of 1.25. In some contexts, a best practice 210 can have a positive impact on a stage objective. In some contexts, a best practice 210 can have a negative impact. For example, best practices 210A-1 have a positive impact, weighting factor 202A-1, on representative job objective 230. In contrast, best practices 210J-Q have a negative impact, weighting factor 202J-Q, on representative job objective 230.

The design process, e.g., design application, can model the probability score from a logistic regression based on the number of steps for the cement pumping procedure and the number of best practices and weighting factor.

$$p = \frac{1}{1 + e^{-(w_0 + w_1 RP_1 + w_2 RP_2 + w_3 RP_3 + \ldots)}}$$

The variable $w_i$ can represent the weighting factor 202A-Z for each best practice 210A-Z. The variable $RP_i$ can represent the best practice 210A-Z. p represents the probability of meeting the job objective or the stage objective.

The design process, e.g., design application, can model the probability score as a continuous variable. The probability score can be modeled with a linear regression. For example, the probability of achieving a top of cement objective can modeled as a probability of achieving a portion or percentage of a target value. In this example, the difference between target and actual top of cement could be a measure of job outcome. In such scenario, one can build a model to predict such quantitative outcome directly instead of a probability (Met or Unmet).

The design process, e.g., design application, can determine the weighting factor 202A-Z and the value assigned to each best practice 210A-Z based on historical data. The values for the best practice 210A-Z and weighting factor 202A-Z can be determined by comparing a modeled outcome or predicted outcome to an outcome of a completed cementing job, e.g., a completed cementing procedure. The outcome of the completed cemented job can be determined by measured field data, e.g., acoustic logs and pressure tests. The design process, e.g., design application, can calculate an error value based on comparing the modeled outcome to the measured field data. The design process may modify the values assigned to the best practice 210A-Z and weighting factor 202A-Z to reduce the error value.

The design process can modify the weighting factor 202A-Z and the value assigned to each best practice 210A-Z based on historical data. The outcome of the stage objective or the job objective along with the steps to the cement pumping procedure, the best practices 210A-Z applied, and the values for the best practices 210A-Z and weighting factors 202A-Z can be written to the database as job outcome data. The design process can read the job outcome data and model the job outcome data based on the best practices 210A-Z and weighting factors 202A-Z. The design process can modify the best practices 210A-Z and weighting factors 202A-Z based on historical data.

Figure 5:
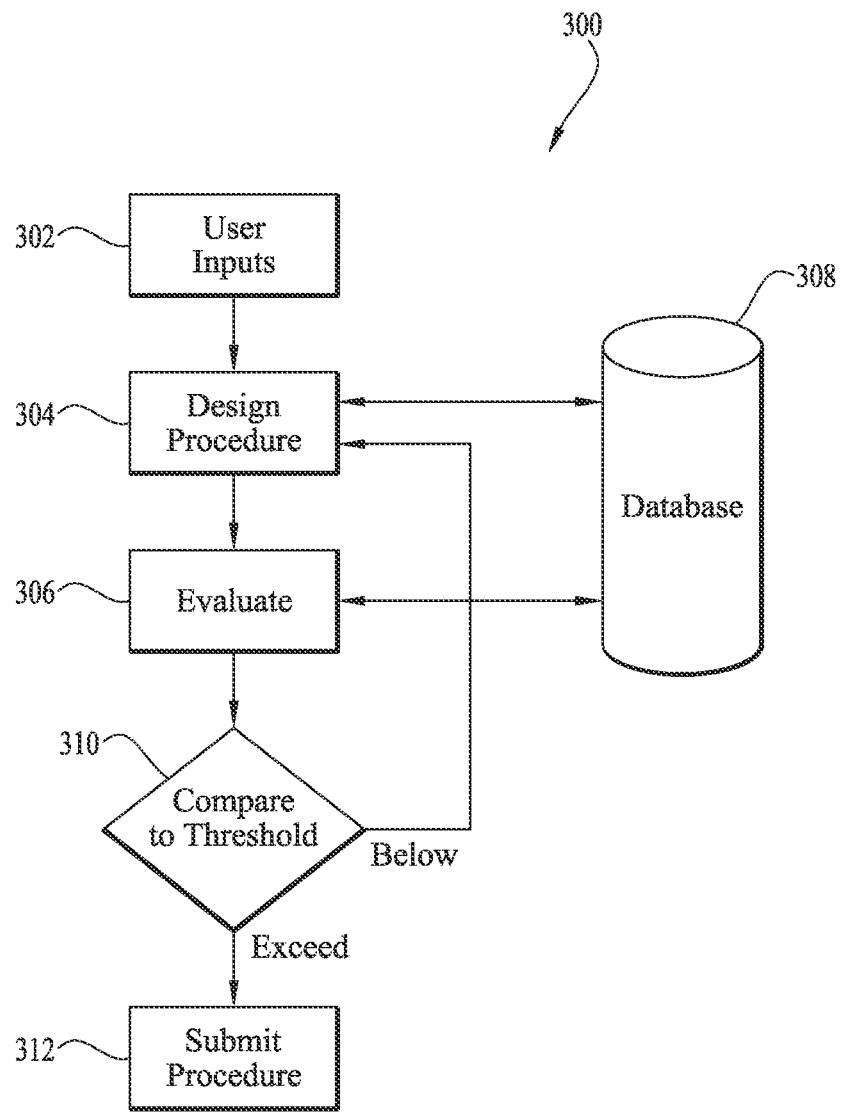
FIG. 5 is a logical flow diagram depicting a cementing procedure design application according to an embodiment of the disclosure.

A method for designing a cement pumping procedure with a design process that utilizes best practice recommendations to achieve one or more stage objectives and/or job objectives can include a probability value determined by a mathematical model. Turning now to FIG. 5, the method 300 for creating a cement pumping procedure is described with a logical flow diagram. At block 302, a set of customer inputs can be entered into a design application to develop a cement pumping procedure on a user device, e.g., computer system. The customer inputs can include wellbore geometry, e.g., pressure, temperature, wellbore depth, wellbore size, drilling mud composition, formation fracturing pressure, and formation material properties. The customer inputs can also include one or more stage objectives and/or job objectives such as a desired cement placement depth, a desired zonal isolation location, a shoe test at a predetermined limit, TOC location, a successful KOP, or combination thereof.

At block 304, the design application may retrieve a first procedure, e.g., generic procedure, from the database 308. The first procedure may be a cement pumping procedure configured to obtain the one or more stage objectives and/or job objectives. The design application may load the customer inputs, e.g., the wellbore geometry and the job objective, into the first procedure. The first procedure may become the cement pumping procedure with the customer inputs. The design application may recommend applying one or more best practices, also called prescribed methodology, to the cement pumping procedure.

At block 306, the design application may access the database 308 to retrieve a plurality of values assigned to best practices, e.g., prescribed methodology. The values assigned to best practices may comprise a value for the best practice 210 and a weighting factor 202 for each best practice. The design application may change the assigned value of the best practice 210 and the weighting factor 202 based on the historical data. The design application may establish a probability score for achieving the job objective based on a probability model utilizing the values assigned the best practice 210 and the weighting factor 202.

At block 310, the design application may compare the probability score 232 of achieving the stage objective and/or the job objective. If the probability score 232 generated from the cement pumping procedure is below a predetermined threshold, the design application may return to block 304. If the probability score 232 generated from the cement pumping procedure is above a predetermined threshold, the design application may query the user to submit the procedure. At block 312, the design application may produce a report and a cement pumping procedure with the one or more best practices.

Although the method 300 is described as a step by step process, it is understood that the design application may combine one or more steps. For example, if the user changes a step to include, change, or remove a best practice 210, the design application may step to block 306 to evaluate, to block 310 to compare to threshold, and return to block 304 to suggest a best practice 210 to increase the probability of achieving the stage objective and/or job objective without accessing that database 308.

A method for designing a cement placement procedure with a machine learning process that utilizes best practice recommendations to achieve one or more stage objectives and/or job objectives can include a training the machine learning process with historical field data. The method for cementing in a wellbore penetrating a subterranean formation may be described. The method may comprise an application executing on a computer system to perform one or more steps to design a cement placement procedure based on customer inputs. The method may include pumping the cement into the wellbore with the cement placement procedure designed within the application.

A customer may transmit one or more customer inputs to the service company or service company personnel. The customer may transmit one or more customer inputs by email, text message, by a customer application, by a service company application, or with a third part application. The customer inputs may comprise a plurality of wellbore data, customer design inputs, and a job objective. For example, the customer may supply a job objective, e.g., cement isolation, a wellbore drilling path, a wellbore depth, a wellbore temperature, and the chemistry or content of drill fluid. In another scenario, the customer design inputs comprise a bill of materials and one or more construction plans. For example, the customer may supply a job objective, e.g., cement isolation, a wellbore drilling path, and a bill of materials of casing, e.g., one or more casing joints and casing equipment. The job objective may include a wellbore isolation, a location of top of cement, a kick off plug, a shoe test, or a combination thereof.

In an embodiment, the customer inputs may comprise a wellbore location. The wellbore location may be at least one of well names, a lease location, global positioning satellite (GPS) coordinates, or an internal designation given by the customer for the wellbore location. A plurality of customer inputs may be indexed to the wellbore location and located on a customer well database, an internal well database, or a shared well database. For example, the wellbore location, provided by the customer, may provide access to a plurality of customer inputs including wellbore data, a plurality of wellbore sensor data, a wellbore drilling path, and wellbore drilling fluid.

In an embodiment, a wellbore history may be indexed to the wellbore location and located on a well database. The wellbore history may comprise a wellbore construction history including, a wellbore survey, a wellbore drilling path, a wellbore drilling bottom hole assembly (e.g., drilling bit size), a wellbore production test, a wellbore production fluid analysis, a wellbore drilling fluid, and a wellhead type. The wellbore history may include a plurality of wellbore data, a plurality of downhole sensor data, and a plurality of equipment data. The plurality of sensor data may comprise any of well logging, wellbore production sample, well control data, wellbore geology, wellsite surveys, and well drilling logs.

The well database may be a local database, e.g., located in a storage location within the internal network. The well database may be located on a remote database, e.g., located on a storage server accessible by a combination of local, private, and public networks. The well database may be located at a customer location, e.g., located on a storage server accessible by any combination of private and public networks.

The customer inputs may be received into a design application executing on a computer system. The design application may be an application executing on a processor within a computer system. The computer system can comprise a laptop computer, a tablet computer, a workstation, a server, a remote server, a virtual computer, a virtual network function, or any combination thereof. The design application may retrieve a generic cement placement procedure in response to one or more of the customer inputs. For example, the design application may retrieve a generic cement placement procedure for wellbore isolation in response to the job objective is wellbore isolation.

The generic cement placement procedure may be cement placement procedure for wellbore isolation, a location of top of cement, a kick off plug, a shoe test, or a combination thereof. The generic cement placement procedure can also be referred to as a revision zero cement placement procedure. The generic cement placement procedure, e.g., revision zero cement placement procedure, is a cement placement procedure comprising a series of sequential stages to achieve the job objective, e.g., wellbore isolation. Each stage of the series of stages, comprise one or more steps with at least one generic methodology. The methodology for a step may be one or more actions performed in sequence to complete one or more steps of a stage. For example, a predetermined blend of cement may be mixed with water at a predefined rate and pumped into a wellbore at a predetermined pump rate. The methodology may comprise a predetermined material, e.g., a cement blend, a predetermined cement equipment, e.g., a float shoe, a predetermined action, e.g., releasing a plug, a predetermined time, e.g., 12 minutes, a predetermined volume, e.g., 50 gallons, a predetermined rate, e.g., 20 barrels per minute, or a combination thereof. The series of steps with the generic methodologies for the stages of the generic cement placement procedure for the given job objective may be machine learning inputs.

The design application may initialize a design cement placement procedure by applying the customer inputs into the generic cement placement procedure. The design application may be referred to as a revision one cement placement procedure. The design cement placement procedure may be referred to as a revision one, revision two, or revision three cement placement procedure as the design application revises, e.g., modifies, the design cement placement procedure.

The design application may calculate a bill of materials and a cement equipment list from the design cement placement procedure. The design application may modify or revise the methodology to a design methodology by applying the bill of materials to more or more steps or stages within the design cement placement procedure, e.g., revision one cement placement procedure. For example, the design application may revise, e.g., modify, the at least one generic methodology to a at least one design methodology with the bill of materials.

The design application may modify the design cement placement procedure by inputting the bill of materials, the design cement placement procedure, and one or more customer inputs into one or more wellbore construction models. The wellbore construction models comprise a casing design model, a casing stretch model, a cement strength model, a well control model, a formation strength model, or a dynamic loading model. The design application may modify the design cement placement procedure in response to at least one wellbore construction model recommending one or more modifications to the bill of materials in response to a calculated design value being lower than a design threshold. For example, referring to FIG. 1, the design application may reduce the number of casing joints, e.g., the length of the casing string 18, in response to the casing stretch model determining the bottom surface 30 of the float shoe 20 may contact the toe 32 of the wellbore 6 during a pumping procedure. The design application may also modify one or more other items on the bill of materials or steps in the design cement placement procedure, e.g., the amount of cement 16 placed into the annular space 26, due the modification of the length of the casing 18. The modified, e.g., revised, design cement placement procedure may be referred to as a revision two cement placement procedure.

The wellbore construction models may determine a current stress state or future stress state of the wellbore, the formation, the casing string, the cement, or a combination thereof. The casing design model may determine the stress state of the casing 18 during the static and dynamic loading of the cement placement. The casing stretch model may determine the stress, strain, and subsequent elongation and contraction of the length of casing 18 due to the ambient wellbore pressure, formation pressure, applied pressure internal pumping pressure, applied annular pressure from surface, cement density, spacer fluid density and drilling fluid density.

The design application may modify one or more stages of the design cement placement procedure with a preferred methodology. The design application may calculate a first probability value for achieving a stage objective with a machine learning process. The machine learning process may determine, e.g., calculate, a first probability value for achieving a stage objective of at least one stage of the design cement placement procedure with at least one design methodology within at least one step of the stage. The design methodology may be a revised design methodology. For example, the design methodology may be a revision two design methodology modified by one or more wellbore construction models. The machine learning process may enable a machine learning process classifier to identify the at least one design methodology of the at least one stage of the design cement placement procedure. The machine learning process classifier may compare the design methodology to one or more training methodologies. The machine learning process classifier may query the database of methodologies to compare and retrieve a methodology grade for the design methodology. The machine learning process classifier can identify a corresponding prescribed methodology within the database. The prescribed methodology may be referred to as a preferred methodology. In some contexts, the prescribed methodology may be referred to as a best practice. The machine learning process can compare the methodology grade of the design methodology to the methodology grade of the corresponding prescribed methodology to determine which value is greater. In this context, the greater value of a methodology grade may yield a greater probability value for achieving a stage objective. The machine learning process may retrieve the prescribed methodology in response to the prescribed methodology having a higher methodology grade.

The machine learning process may determine a second probability value for achieving the stage objective with a prescribed methodology retrieved from the database of methodologies. The machine learning process may compare the first probability value for the design methodology to the second probability value for the prescribed, e.g., preferred, methodology. If the probability value for achieving the stage objective with the prescribed methodology is greater than the probability value for achieving the stage objective with the design probability, the machine learning process may replace the at least one design methodology within the at least one step of the stage with the prescribed methodology.

The design application may generate a final cement placement procedure by modifying the design cement placement procedure. The design application may utilize the machine learning process to modify the design cement placement procedure with one or more prescribed, e.g., preferred, methodologies in response to a probability value for the design cement placement procedure with the one or more prescribed methodologies being greater than the probability value for the design cement placement procedure without the one or more prescribed methodologies. The machine learning process may determine a probability value for achieving the job objective with the design methodologies and compare the probability value to a threshold value.

If the probability value determined from the design methodologies is below a threshold value, the machine learning process may replace, e.g., modify, at least one design methodologies with a prescribed methodology. The design application may generate a final cement placement procedure in response to the probability value exceeding the threshold value.

In an embodiment, cement may be pumped, e.g., placed, into the wellbore in accordance with the final cement placement procedure. The design application may provide the instructions to one or more pumping equipment units to pump the cement into the wellbore. In an embodiment, a managing application may be utilized to communicate with, e.g., provide instructions, to one or more pumping equipment units to place the cement blend into the wellbore.

In an embodiment, the method of cementing a wellbore may include transporting a cement blend and a plurality of cement pumping equipment to a well site. The cement blend, the pumping equipment units, and cementing equipment may be included in the cement placement procedure. In an aspect, the cement blend, the pumping equipment units, and cementing equipment may be included in the bill of materials.

The method of cementing a wellbore may include pumping the cement into the wellbore by the design application per the final cement placement procedure. The design application may be communicatively connected to a controller. The controller may be communicatively connected to a unit controller on one or more cementing equipment units. The controller may establish unit control over one or more cementing equipment units. The controller may be communicatively connected to one or more sensors on one or more cement pumping units. The controller may be communicatively connected to one or more sensors connected to the wellbore, e.g., wellhead sensors and/or downhole sensors. The design application may retrieve one or more data sets of periodic pumping data indicative of the cement placement procedure. The design application may mix a cement slurry with one or more cement pumping units per the final cement placement procedure. The design application may pump the cement slurry per the final cement placement procedure. It is understood that the design application may include a plurality of steps not described such as pumping a spacer fluid, launching a wiper dart, or circulating a volume of drilling fluid.

The method of cementing a wellbore may include the design application alerting the service personnel if a prescribed methodology included in a step within a stage of the cementing placement procedure is not found, e.g., not performed. A prescribed methodology within the final cement placement procedure may not be performed due to a change in the environment of the wellbore, e.g., the measured pressure in the annulus. For example, the pressure sensors communicating with the wellbore 6 may indicate a drop in wellbore pressure caused by fluid leaking into the formation 8. The change in the environment of the wellbore, e.g., fluid leak-off, may cause the service personnel to deviate from the final cement placement procedure. The design application may calculate, determine with the machine learning process, a new probability score of for achieving the job objective based on the change to the final cement placement procedure. The design application may recommend, with the machine learning process, one or more prescribed methodologies to apply to one of more subsequent steps of the cement placement procedure. The machine learning process may determine a probability score for achieve the job objective based on the changes to the cement placement procedure. If the probability score is below a threshold value, the machine learning process may recommend one or more prescribed methodologies to increase the probability score above the threshold value.

The method of cementing a wellbore may include placing one or more downhole tools into the wellbore per the final cement placement procedure. The service personnel may transport one or more downhole tools to a well site. The one or more downhole tools may be included in the final cement placement procedure. In an aspect, the one or more downhole tools may be included in the bill of materials within the final cement placement procedure.

The method of cementing a wellbore may follow the final cementing procedure. The design application may begin the final cement placement procedure. The one or more downhole tools may be coupled to the casing per the final cement placement procedure. It is understood that coupling the downhole tools to the casing may include connecting the downhole tool to the casing, e.g., threadingly connecting, releasably attaching the downhole tool to the casing, e.g., spanning the circumference, anchoring the downhole tool to the inside surface of the casing, e.g., slip mechanism, releasing a downhole tool into the inside of the casing, e.g., cementing wiper plug, dropping a downhole tool into the casing, e.g., a drop bar, or a combination thereof.

As previously described, the design application may retrieve one or more data sets of periodic pumping data indicative of the final cement placement procedure. The method of cementing a wellbore may include the design application alerting the service personnel if a prescribed methodology included in a step within a stage of the cementing placement procedure is not found, e.g., not performed. The design application may calculate, determine with the machine learning process, a new probability score of for achieving the job objective based on the change to the final cement placement procedure. The design application may recommend, with the machine learning process, one or more prescribed methodologies to apply to one of more subsequent steps of the cement placement procedure. The machine learning process may determine a probability score for achieve the job objective based on the changes to the cement placement procedure. If the probability score is below a threshold value, the machine learning process may recommend one or more prescribed methodologies to increase the probability score above the threshold value.

The previously described method for cementing a wellbore with a cement placement procedure designed with a design application utilized a machine learning process to determine a probability value based on prescribed methodologies. The machine learning process may be trained to determine a value for the methodologies found within a cement placement procedure based on historical field data and completed cement placement procedures. A method for training a machine learning process for cementing a wellbore may be described.

In an embodiment, a method of training a machine learning process for constructing a wellbore may comprise a machine learning process executing on a computer system. The machine learning process may retrieve a completed cement placement procedure from a well construction database. The completed cement placement procedure may comprise a series of sequential stages to achieve the job objective and each completed stage of the completed cement placement procedure may include at least one methodology. The machine learning process may enable a machine learning classifier. The machine learning classifier identifies the machine learning inputs from a training sample. The machine learning classifier may identify a format of the completed cement placement procedure to determine the type of cement placement procedure the completed cement placement procedure belongs to, e.g., the job objective of the completed cement placement procedure. The format of the completed cement placement procedure comprises a job objective, a plurality of stages, a plurality of wellbore data, and a plurality of measured field data.

The well construction database may be a local database, e.g., located in a storage location within an internal network. The well construction database may be located on a remote storage location, e.g., located on a storage server accessible by a combination of local, private, and public networks. The well construction database may be located at a customer location, e.g., located on a storage server accessible by any combination of private and public networks.

The machine learning classifier of the machine learning process may retrieve the plurality of stages from the completed cement placement procedure. The plurality of stages may comprise multiple steps within each stage and multiple methodologies within each stage. The machine learning classifier may identify at least one completed methodology within a completed stage of the completed cement placement procedure by comparing a training set of training stages comprising training methodologies to the methodologies identified within the completed stages. The machine learning classifier may generate machine learning inputs for the machine learning process from the completed methodologies corresponding to the completed stages.

The machine learning classifier may utilize a supervised learning process in response to the machine learning classifier recognizing the format of the graded cement placement procedure. The machine learning classifier may switch to an unsupervised learning process in response to the machine learning classifier not recognizing the format.

The machine learning process may grade each of the completed methodologies corresponding to the completed stages by comparing the completed stage objective to a plurality of measured field data. For example, referring to FIG. 1, the machine learning process may determine a grade for one or more methodologies used to place cement 16 into the annular space 26 based on the field data from a LOT test performed at the wellsite. The grade determined by the machine learning process may comprise a weighting factor for the completed methodology and a methodology value for the completed methodology.

The machine learning process may validate the completed methodology grade and corresponding completed stage by comparing the completed methodology grade to one or more preferred methodologies within the methodology database. The machine learning process may modify the completed methodology grade in response to the completed methodology grade grading higher than a preferred methodology for the same stage objective. The machine learning process may store the methodology grade and corresponding completed stage to the methodology database.

The machine learning process may produce a combined methodology grade for each completed stage that utilizes multiple methodologies within a stage. The combined methodology grade includes all the steps and methodologies for a stage to produce a grade for the stage. For example, the chemistry used for a spacer fluid combined with the volume and flowrate may combine three or more methodologies into one methodology value for the spacer fluid. The machine leaning process may determine a combined methodology grade by comparing at least one completed stage using more than one methodology to the plurality of measured field data corresponding to the completed stage.

The machine learning process may validate the combined methodology grade by comparing a predictive stage objective grade using the completed methodology grade to the completed stage objective grade to determine an error value. The completed stage objective grade comprises the plurality of measured field data, a completed job objective grade, and a plurality of completed stage objective grades. The training method for the machine learning process may train the machine learning process to reduce the error value.

A method for placing cementing into wellbore with a final cement placement procedure may utilize a managing application to recommend changes to the operation based on machine learning. A method for placing cement into a wellbore with a machine learning process managing the operation per a final cement placement procedure may be described.

A method of placing cement within a wellbore utilizing a historical database of wellbore construction may comprise a managing application executing on a computer system. The managing application may retrieve a final cement placement procedure comprising a series of sequential stages to achieve a job objective, a plurality of customer wellbore data, and a plurality of stage objectives from a database. The wellbore data may comprise wellbore diameter, casing size, casing thread type, pressure, temperature, formation geology, and wellbore trajectory. The database may be on the computer system, a local network, a local data source, or a remote data source. The remote data source may be a server, a computer, a virtual computer, a virtual network function, or data storage device. The job objective may comprise a successful test of a barrier within the wellbore. The barrier may be a cement sheath disposed within an annulus formed between a casing and the inner wall of the wellbore. Each stage of the final cement placement procedure may include one or more prescribed methodologies within the steps of the stage.

The service personnel may transport a cement blend and a plurality of cement pumping equipment, e.g., pumping units, to a well site. The cement blend and cement pumping units may be included in the final cement placement procedure. For example, the cement blend may be included in the bill of materials. The service personnel may begin the final cement placement procedure by the managing application executing on the computer system.

The managing application may retrieve one or more data sets of periodic pumping data indicative of the final cement placement procedure. As previously described, the managing application may be communicatively connected to a controller. The controller may establish control with a unit controller on each pumping unit. The controller may be communicatively connected to one or more sensors connected to the wellbore, e.g., wellhead sensors and/or downhole sensors. The sensors may provide data sets indicative of the final cement placement procedure.

The managing application may begin, e.g., start, a current stage of the final cement placement procedure. The current stage can be one of the stages of the final cement placement procedure. The managing application may alert the service personnel if the one or more prescribed methodology included in the current stage of the final cementing placement procedure is not found. For example, if the service personnel deviate from the final cement placement procedure in response to a wellbore environment change.

The managing application may determine a probability of achieving the stage objective without the prescribed methodology based on machine learning process by accessing a database of methodologies for cement placement procedures. If the probability value for achieving the stage objective is below a threshold value, the machine learning process may recommend one or more prescribed methodologies to apply to one or more steps within the current stage or subsequent to the current stage of the final cement placement procedure to increase a probability score above a threshold value.

If the probability value for achieving the stage objective is above a threshold value, the machine learning process may recommend continuing the final cement placement procedure in response to the probability score being above the threshold value for achieving the job objective.

The method for designing a cement pumping procedure with a design process that utilizes best practice recommendations to achieve one or more stage objectives and/or job objectives can monitor the cementing pumping procedure and alert the user if one or more best practices are missing.

The method for monitoring a cement pumping procedure can begin with the service personnel transporting a cement blend, e.g., dry cement mixture, a water supply, and a plurality of cement pumping equipment, that are included in the cement pumping procedure, to a well site. The service personnel may also transport one or more downhole tools, that are included in the cement pumping procedure, to the well site.

The design application, executing on a computer, may retrieve cement pumping data from the cement pumping equipment, e.g., blender and pumps, and from one or more sensors connected to the wellhead. In some contexts, the design application may retrieve data from one or more sensors located in the wellbore, e.g., downhole sensors. The cement pumping data may comprise one or more data sets of periodic pumping data indicative of the cement pumping procedure.

The service personnel may pump a cement slurry by mixing the cement blend and water from the water supply in the cement pumping equipment, per the cement pumping procedure. The design application may monitor the cement pumping procedure with the cement pumping data received from the sensors on the equipment, wellhead, and downhole. The design application may alert the service personnel a best practice included in the cementing pumping procedure is not found, e.g., the data indicates the cement pumping procedure has deviated from a best practice. The design application may recalculate the probability score based on a model for achieving the job objective and/or stage objective without the best practice. The model may be the mathematical model. The design application may alert the service personnel of the new probability score.

The design application may recommend one or more best practices, e.g., prescribed methodologies, to apply to one of more subsequent steps, e.g., the remaining steps, of the cement pumping procedure to increase the probability score above a threshold value. The design application may alert the service personnel of the new probability score.

Additional Disclosure—Part I

The following are non-limiting, specific embodiments in accordance with the present disclosure:

A first embodiment, which is a computer-implemented method of designing a cement pumping procedure of a wellbore isolation barrier, comprising receiving one or more customer inputs, by a design application executing on a computer system, wherein the one or more customer inputs comprise a plurality of wellbore data and a job objective; retrieving a first procedure, by the design application, from a database, wherein the first procedure is a cement pumping procedure comprising a series of sequential steps to achieve the job objective, and wherein at least one methodology is specified in the cement pumping procedure; loading, by the design application, the plurality of wellbore data and the job objective into the cement pumping procedure; accessing a plurality of values assigned to the at least one methodology from the database, wherein the plurality of values comprise a weighting factor and a methodology factor; establishing, by the design application, a probability score for achieving the job objective is calculated by a probability model; comparing, by the design application, the probability score to a threshold value for achieving the job objective; recommending, by the design application, applying one or more prescribed methodologies to one or more steps of the cement pumping procedure in response to the probability score being below a threshold value; and continuing the cement pumping procedure, by the design application, in response to the probability score being above the threshold value for achieving the job objective.

A second embodiment, which is the method of the first embodiment, wherein the job objective comprises a successful test of a shoe test, a zonal isolation, a top of cement, and a kick off plug.

A third embodiment, which is the method of the first and second embodiment, wherein the cement pumping procedure comprises a series of stage objectives; wherein the stage objective comprises at least one methodology.

A fourth embodiment, which is the method of any of the first through third embodiments, wherein the wellbore data comprises wellbore diameter, casing size, casing thread type, pressure, temperature, formation geology, and wellbore trajectory.

A fifth embodiment, which is the method of any of the first through the fourth embodiments, wherein the probability model is a mathematical model, wherein the mathematical model is a logistic regression wherein the one or more prescribed methodologies are assigned a first value, and wherein the one or more prescribed methodologies are assigned a second weighted value.

A sixth embodiment, which is the method of any of the first through the fifth embodiments, wherein the database is on a remote data source, and wherein the remote data source is data server, computer, or data storage device.

A seventh embodiment, which is the method of any of the first through the sixth embodiments, wherein the job objective comprises a successful test of a barrier, wherein the barrier is a cement sheath disposed within an annulus formed between a casing disposed within the well and a wall of the wellbore.

An eighth embodiment, which is the method of any of the first through the seventh embodiments, further comprising transporting a cement blend and a plurality of cement pumping equipment to a well site, wherein the cement blend is included in the cement pumping procedure; beginning the cement pumping procedure by the design application; retrieving, by the design application, one or more data sets of periodic pumping data indicative of the cement pumping procedure; mixing a cement slurry, by the cement pumping equipment, per the cement pumping procedure; pumping the cement slurry per the cement pumping procedure; alerting, by the design application, if the prescribed methodology included in the cementing pumping procedure is not found; calculating, by the design application, the probability score of for achieving the job objective based on a probability model; recommending, by the design application, one or more prescribed methodology to apply to one of more subsequent steps of the cement pumping procedure to increase the probability score above a threshold value; and continuing the cement pumping procedure, by the design application, in response to the probability score being above the threshold value for achieving the job objective.

A ninth embodiment, which is the method of any of the first through the eighth embodiments, wherein the cement blend is a Portland cement comprised of a hydraulic cement with a source of free lime and alkali ions, a source of calcium carbonate, a source of calcium sulfate and an organic component.

A tenth embodiment, which is the method of any of the first through the ninth embodiments, further comprising transporting a downhole tool to a well site, wherein the downhole tool is included in the cement pumping procedure; beginning the cement pumping procedure by the design application; coupling the downhole tool with the casing via the cement pumping procedure; retrieving, by the design application, one or more data sets of periodic pumping data indicative of the cement pumping procedure; alerting, by the design application, if a prescribed methodology included in the cementing pumping procedure is not found; calculating, by the design application, the probability score of for achieving the job objective based on a probability model; recommending, by the design application, one or more prescribed methodology to apply to one of more subsequent steps of the cement pumping procedure to increase the probability score above a threshold value; and continuing the cement pumping procedure, by the design application, in response to the probability score being above the threshold value for achieving the job objective.

An eleventh embodiment, which is a computer-implemented method of designing a cement pumping procedure of a wellbore isolation barrier, comprising retrieving a cement pumping procedure, by a design application executing on a computer system, from a database, wherein the cement pumping procedure comprising a series of sequential steps to achieve a job objective, and wherein at least one methodology is specified in the cement pumping procedure; modifying one or more customer inputs, by the design application, wherein the one or more customer inputs comprise a plurality of wellbore data and a plurality of stage objectives; accessing a plurality of values assigned to prescribed methodologies from a database, wherein the plurality of values comprise a weighting factor and a methodology factor; calculating, by the design application, a probability score for achieving the plurality of stage objectives, wherein the probability score is calculated by a probability model; comparing, by the design application, the probability score for each stage objective to a threshold value; recommending, by the design application, modifying one or more steps of the cementing pumping procedure by applying one or more prescribed methodologies to the one or more steps of the cement pumping procedure in response to the probability score being below a threshold value; and continuing the cement pumping procedure, by the design application, in response to the probability score being above the threshold value for achieving the job objective.

A twelfth embodiment, which is the method of the eleventh embodiment, wherein the job objective comprises a shoe test, zonal isolation, top of cement, and kick off plug.

A thirteenth embodiment, which is the method of any of the eleventh through the twelfth embodiment, wherein the job objective comprises a series of stage objectives; wherein the stage objective comprises at least one methodology.

A fourteenth embodiment, which is a method of any of the eleventh through the thirteenth embodiment, wherein the wellbore data comprises wellbore diameter, casing size, casing thread type, pressure, temperature, formation geology, and wellbore trajectory.

A fifteenth embodiment, which is the method of the eleventh through the fourteenth embodiment, wherein the probability model is a mathematical model, wherein the mathematical model is a logistic regression, wherein the one or more prescribed methodologies are assigned a first value, and wherein the one or more prescribed methodologies are assigned a second weighted value.

A sixteenth embodiment, which is the method of the eleventh through the fifteenth embodiment, wherein the database is on a remote data source, and wherein the remote data source is data server, computer, or data storage device.

A seventeenth embodiment, which is the method of any of the eleventh through sixteenth embodiments, further comprising transporting a cement blend and a plurality of cement pumping equipment to a well site, wherein the cement blend is included in the cement pumping procedure; beginning the cement pumping procedure by the design application; retrieving, by the design application, one or more data sets of periodic pumping data indicative of the cement pumping procedure; mixing a cement slurry, by the cement pumping equipment, per the cement pumping procedure; pumping the cement slurry per the cement pumping procedure; alerting, by the design application, if the prescribed methodology included in the cementing pumping procedure is not found; calculating, by the design application, the probability score of for achieving the job objective based on a probability model; recommending, by the design application, one or more prescribed methodology to apply to one of more subsequent steps of the cement pumping procedure to increase the probability score above a threshold value; and continuing the cement pumping procedure, by the design application, in response to the probability score being above the threshold value for achieving the job objective.

An eighteenth embodiment, which is a method of any of the eleventh through the seventeenth embodiments, further comprising transporting a downhole tool to a well site, wherein the downhole tool is included in the cement pumping procedure; beginning the cement pumping procedure by the design application; coupling the downhole tool with the casing via the cement pumping procedure; retrieving, by the design application, one or more data sets of periodic pumping data indicative of the cement pumping procedure; alerting, by the design application, if a prescribed methodology included in the cementing pumping procedure is not found; calculating, by the design application, the probability score of for achieving the job objective based on a probability model; recommending, by the design application, one or more prescribed methodologies to apply to one of more subsequent steps of the cement pumping procedure to increase the probability score above a threshold value; and continuing the cement pumping procedure, by the design application, in response to the probability score being above the threshold value for achieving the job objective.

A nineteenth embodiment, which is a computer-implemented method of designing a cement pumping procedure, comprising loading a cement pumping procedure into a design application executing on a computer system, wherein the cement pumping procedure comprises a series of sequential steps to achieve a job objective; inputting one or more customer inputs, by a design application, wherein the one or more customer inputs comprise a plurality of wellbore data and the job objectives; accessing a plurality of updated values assigned to prescribed methodologies from a database, wherein the plurality of values comprise a weighting factor and a methodology factor; recalculating, by the design application, a probability score for achieving the job objective, wherein the probability score is based on a probability model, wherein the calculation utilizes the updated values assigned to the plurality of prescribed methodologies; comparing, by the design application, the probability score for the job objective to a threshold value for achieving the job objective; recommending, by the design application, modifying one or more steps of the cementing pumping procedure by applying one or more prescribed methodologies to the one or more steps of the cement pumping procedure in response to the probability score being below a threshold value; and continuing the cement pumping procedure, by the design application, in response to the probability score being above the threshold value for achieving the job objective.

A twentieth embodiment, which is the method of the nineteenth embodiment, wherein the job objective comprises a shoe test, zonal isolation, top of cement, and kick off plug.

A twenty-first embodiment, which is a method of the nineteenth or twentieth embodiment, wherein the cement pumping procedure comprises a series of stage objectives, wherein the stage objective comprises at least one methodology.

A twenty-second embodiment, which is the method of any of the nineteenth through the twenty-first embodiment, wherein the wellbore data comprises wellbore diameter, casing size, casing thread type, pressure, temperature, formation geology, and wellbore trajectory.

A twenty-third embodiment, which is the method of any of the nineteenth through the twenty-second embodiment, wherein the probability model is a mathematical model, wherein the mathematical model is a logistic regression, wherein the one or more prescribed methodologies are assigned a first value, and wherein the one or more prescribed methodologies are assigned a second weighted value.

A twenty-fourth embodiment, which is the method of any of the nineteenth through the twenty-third embodiment, wherein the database is on a remote data source, and wherein the remote data source is data server, computer, or data storage device.

A twenty-fifth embodiment, which is the method of any of the nineteenth through the twenty-fourth embodiment, further comprising transporting a cement blend and a plurality of cement pumping equipment to a well site, wherein the cement blend is included in the cement pumping procedure; beginning the cement pumping procedure by the design application; retrieving, by the design application, one or more data sets of periodic pumping data indicative of the cement pumping procedure; mixing a cement slurry, by the cement pumping equipment, per the cement pumping procedure; pumping the cement slurry per the cement pumping procedure; alerting, by the design application, if the prescribed methodology included in the cementing pumping procedure is not found; calculating, by the design application, the probability score of for achieving the job objective based on a probability model; recommending, by the design application, one or more prescribed methodologies to apply to one of more subsequent steps of the cement pumping procedure to increase the probability score above a threshold value; and continuing the cement pumping procedure, by the design application, in response to the probability score being above the threshold value for achieving the job objective.

A twenty-fifth embodiment, which is the method of any of the nineteenth through the twenty-fourth embodiment, further comprising transporting a downhole tool to a well site, wherein the downhole tool is included in the cement pumping procedure; beginning the cement pumping procedure by the design application; coupling the downhole tool with the casing via the cement pumping procedure; retrieving, by the design application, one or more data sets of periodic pumping data indicative of the cement pumping procedure; alerting, by the design application, if the prescribed methodology included in the cementing pumping procedure is not found; calculating, by the design application, the probability score of for achieving the job objective based on a probability model; recommending, by the design application, one or more prescribed methodologies to apply to one of more subsequent steps of the cement pumping procedure to increase the probability score above a threshold value; and continuing the cement pumping procedure, by the design application, in response to the probability score being above the threshold value for achieving the job objective.

A twenty-sixth embodiment, which is a method of constructing a wellbore, comprising receiving one or more customer inputs, by a design application executing on a computer system, wherein the one or more customer inputs comprise a plurality of wellbore data and a job objective; retrieving a revision zero cement pumping procedure, by the design application, from a database, wherein the revision zero cement pumping procedure is a cement pumping procedure comprising a series of sequential stages to achieve the job objective, wherein the stages comprise one or more steps with at least one revision zero methodology, and wherein the stages and the at least one revision zero methodology are machine learning inputs; initializing a revision one cement pumping procedure, by the design application, by applying the customer inputs into the revision zero cement pumping procedure; calculating, by the design application, a bill of materials and a cement equipment list from the revision one cement pumping procedure, and wherein the design application modifies the at least one revision zero methodology to a at least one revision one methodology with the bill of materials; comparing, by the machine learning process, a revision one probability value for achieving a stage objective of at least one stage of the revision one cement pumping procedure for the at least one revision one methodology within at least one step within the stage to a delta probability value for achieving the stage objective with a prescribed methodology, wherein the prescribed methodology is retrieved from a database, and wherein the prescribed methodology has a higher methodology grade than the revision one methodology; generating, by the machine learning process, a revision two cement pumping procedure by modifying the revision one cement pumping procedure with one or more prescribed methodologies in response to the delta probability value being greater than the revision one probability value; and placing cement in the wellbore in accordance with the procedure.

A twenty-seventh embodiment, which is the method of the twenty-sixth embodiment, wherein a machine learning process classifier identifies the at least one revision one methodology of the at least one stage of the revision one cement pumping procedure and identifies a corresponding prescribed methodology within the database; wherein the machine learning process compares the methodology grade of the revision one methodology to the methodology grade of the corresponding prescribed methodology; and wherein the machine learning process retrieves the prescribed methodology in response to the prescribed methodology having a higher methodology grade.

A twenty-eighth embodiment, which is a method of training a machine learning process for constructing a wellbore, comprising retrieving, by a machine learning process executing on a computer system, a graded cement pumping procedure comprising a series of sequential stages to achieve a job objective, a plurality of customer wellbore data, and a plurality of measured field data, and wherein each stage of the cement pumping procedure includes one or more methodologies; training a machine learning classifier to identify a variety of anticipated methodologies corresponding to an anticipated stage objective of each stage of the cement pumping procedure, wherein the anticipated methodologies and anticipated stage objectives are inputs to the machine learning process; validating, by the machine learning process, the anticipated methodologies within the stage of the cement pumping procedure by comparing the anticipated stage objective to a completed stage objective; wherein the completed stage objective comprises a plurality of measured field data; generating, by the machine learning process, the one or more anticipated methodologies as a one or more reported methodologies; producing a methodology grade, by the machine learning process, by grading the one or more reported methodologies corresponding to an anticipated stage objective, and wherein the methodology grade comprises a weighting factor and a methodology value; modifying the methodology grade, by the machine learning process, by comparing the reported methodology to a database of reported methodologies: validating the methodology grade by comparing a predictive stage objective grade using the methodology grade to a reported stage objective grade to determine an error value, and wherein the reported stage objective grade comprises the plurality of measured field data, a reported job objective grade, and a plurality of reported stage objective grades; and training the machine learning process to reduce the error value.

A twenty-ninth embodiment, which is the method of the twenty-eighth embodiment, further comprising training the machine learning process with supervised learning in response to the machine learning classifier recognizing the format of the graded cement pumping procedure.

A thirtieth embodiment, which is a method of placing cement within a wellbore utilizing a historical database of wellbore construction, comprising retrieving, by a managing application executing on a computer system, an approved cement pumping procedure comprising a series of sequential stages to achieve a job objective, a plurality of customer wellbore data, and a plurality of stage objectives, and wherein each stage of the approved cement pumping procedure includes one or more prescribed methodologies; transporting a cement blend and a plurality of cement pumping equipment to a well site, wherein the cement blend is included in the approved cement pumping procedure; beginning the approved cement pumping procedure by the managing application; retrieving, by the managing application, one or more data sets of periodic pumping data indicative of the approved cement pumping procedure: beginning, by the managing application, a current stage of the approved cement pumping procedure, wherein the current stage is one of the stages of the approved cement pumping procedure; alerting, by the managing application, if the one or more prescribed methodology included in the current stage of the approved cementing pumping procedure is not found; determining, by the design application, a probability of achieving the stage objective without the prescribed methodology based on machine learning process by accessing a database of methodologies for cement pumping procedures; recommending, by the machine learning process, one or more prescribed methodologies to apply to one or more steps within the current stage or subsequent to the current stage of the approved cement pumping procedure to increase the probability score above a threshold value; and continuing the approved cement pumping procedure, by the design application, in response to the probability score being above the threshold value for achieving the job objective.

A thirty-first embodiment, which is a method of cementing in a wellbore penetrating a subterranean formation, comprising receiving one or more customer inputs, by a design application executing on a computer system; initializing a design cement placement procedure, by the design application, by applying the customer inputs into a generic cement placement procedure; generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies; and placing cement in the wellbore in accordance with the final cement placement procedure.

A thirty-second embodiment, which is a method of the thirty-first embodiment, further comprising retrieving the generic cement placement procedure, by the design application, from a database, wherein the generic cement placement procedure is a cement placement procedure comprising a series of sequential stages to achieve the job objective, wherein the stages comprise one or more steps with at least one generic methodology, and wherein the stages and the at least one generic methodology are machine learning inputs.

A thirty-third embodiment, which is a method of either the thirty-first embodiment or the thirty-second embodiment, further comprising calculating, by the design application, a bill of materials and a cement equipment list from the design cement placement procedure, and wherein the design application modifies the at least one generic methodology to a at least one design methodology with the bill of materials.

Additional Disclosure—Part II

A first embodiment, which is a method of cementing in a wellbore penetrating a subterranean formation, comprising receiving one or more customer inputs, by a design application executing on a computer system, initializing a design cement placement procedure, by the design application, by applying the customer inputs into a generic cement placement procedure, generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies, and placing cement in the wellbore in accordance with the final cement placement procedure.

A second embodiment, which is the method of the first embodiment, further comprising retrieving the generic cement placement procedure, by the design application, from a database, wherein the generic cement placement procedure is a cement placement procedure comprising a series of sequential stages to achieve the job objective, wherein the stages comprise one or more steps with at least one generic methodology, and wherein the stages and the at least one generic methodology are machine learning inputs.

A third embodiment, which is the method of the first embodiment, further comprising calculating, by the design application, a bill of materials and a cement equipment list from the design cement placement procedure, and wherein the design application modifies the at least one generic methodology to a at least one design methodology with the bill of materials.

A fourth embodiment, which is the method of the third embodiment, further comprising modifying, by the design application, the design cement placement procedure by inputting the bill of materials, design cement placement procedure, and one or more customer inputs into one or more wellbore construction models, wherein the wellbore construction models comprise casing design model, casing stretch model, cement strength model, well control model, formation strength model, or dynamic loading model, wherein at least one wellbore construction model recommends modifying the bill of materials in response to a calculated design value being lower than a design threshold.

A fifth embodiment, which is the method of the fourth embodiment, wherein a machine learning process classifier identifies the at least one design methodology of the at least one stage of the design cement placement procedure, the machine learning process classifier determines a methodology grade for the design methodology within the database, the machine learning process classifier identifies a corresponding prescribed methodology within the database, wherein the machine learning process compares the methodology grade of the design methodology to the methodology grade of the corresponding prescribed methodology, and wherein the machine learning process retrieves the prescribed methodology in response to the prescribed methodology having a higher methodology grade.

A sixth embodiment, which is the method of the fifth embodiment, further comprising comparing, by the machine learning process, a first probability value for achieving a stage objective of at least one stage of the design cement placement procedure with at least one design methodology within at least one step of the stage to a second probability value for achieving the stage objective with a prescribed methodology, wherein the prescribed methodology is retrieved from the database, and wherein the prescribed methodology has a higher methodology grade than the design methodology, and replacing, by the machine learning process, the at least one design methodology within the at least one step of the stage with the prescribed methodology in response to the second probability value being greater than the first probability value for achieving a stage objective.

A seventh embodiment, which is the method of any of the first through the sixth embodiments, wherein the one or more customer inputs comprise a plurality of wellbore data, a plurality of customer design inputs, and a job objective, and wherein the customer design inputs comprise a bill of materials and one or more construction plans.

An eighth embodiment, which is the method of the seventh embodiment, wherein the wellbore data comprises a wellbore location, a wellbore history, and a plurality of sensor data, wherein the wellbore location comprises well names, a lease location, global positioning satellite (GPS) coordinates, an internal designation, or a combination thereof, wherein the wellbore history comprises a wellbore survey, a wellbore drilling path, a wellbore production fluid analysis, a wellbore drilling fluid, and a wellbore construction history, and wherein the plurality of sensor data comprises well logging, wellbore production sample, and well control data.

A ninth embodiment, which is the method of the seventh embodiment, wherein the job objective comprises wellbore isolation, a location of top of cement, a kick off plug, a shoe test, or a combination thereof.

A tenth embodiment, which is the method of and of the first through the ninth embodiments, further comprising transporting a cement blend and a plurality of cement pumping equipment to a well site, wherein the cement blend is included in the cement placement procedure, beginning the cement placement procedure by the design application, retrieving, by the design application, one or more data sets of periodic pumping data indicative of the cement placement procedure, mixing a cement slurry, by the cement pumping equipment, per the cement placement procedure, pumping the cement slurry per the cement placement procedure, alerting, by the design application, if the prescribed methodology included in the cementing placement procedure is not found, calculating, the machine learning process, a probability score of for achieving the job objective based on a probability model, recommending, by the machine learning process, one or more prescribed methodology to apply to one of more subsequent steps of the cement placement procedure to increase the probability score above a threshold value, and continuing the cement placement procedure, by the design application, in response to the probability score being above the threshold value for achieving the job objective.

An eleventh embodiment, which is the method of any of the first through the tenth embodiments, further comprising transporting a downhole tool to a well site, wherein the downhole tool is included in the cement placement procedure, beginning the cement placement procedure by the design application, coupling the downhole tool with a casing via the cement placement procedure, retrieving, by the design application, one or more data sets of periodic pumping data indicative of the cement placement procedure, alerting, by the design application, if a prescribed methodology included in the cementing placement procedure is not found, calculating, by the machine learning process, a probability score of for achieving the job objective based on a probability model, recommending, by the machine learning process, one or more prescribed methodologies to apply to one of more subsequent steps of the cement placement procedure to increase the probability score above a threshold value, and continuing the cement placement procedure, by the design application, in response to the probability score being above the threshold value for achieving the job objective.

A twelfth embodiment, which is a method of training a machine learning process for constructing a wellbore, comprising retrieving, by a machine learning process executing on a computer system, a completed cement placement procedure, identifying, by a machine learning classifier of the machine learning process, a format of the completed cement placement procedure, wherein the format comprises a job objective, a plurality of stages, a plurality of wellbore data, and a plurality of measured field data, retrieving, by the machine learning classifier, the plurality of stages from the completed cement placement procedure, producing, by the machine learning process, a combined methodology grade for each completed stage by comparing at least one completed stage of the plurality of stages to the plurality of measured field data corresponding to the completed stage, and wherein the combined methodology grade comprises a plurality of completed methodologies within the completed stage, validating, by the machine learning process, the combined methodology grade by comparing a predictive stage objective grade using the completed methodology grade to the completed stage objective grade to determine an error value, and wherein the completed stage objective grade comprises the plurality of measured field data, a completed job objective grade, and a plurality of completed stage objective grades, and training the machine learning process to reduce the error value.

A thirteenth embodiment, which is the method of the twelfth embodiment, wherein the completed cement placement procedure comprises a series of sequential stages to achieve the job objective, and wherein each completed stage of the cement placement procedure includes at least one completed methodologies.

A fourteenth embodiment, which is the method of the thirteenth embodiment, further comprising identifying, by the machine learning classifier, at least one completed methodology within a completed stage of the completed cement placement procedure by comparing a training set of training stages comprising training methodologies to the completed stage comprising the least one completed methodologies of the completed cement placement procedure, wherein the least one completed methodology corresponding to the completed stage are inputs to the machine learning process.

A fifteenth embodiment, which is the method of the fourteenth embodiment, further comprising grading, by the machine learning process, the at least one completed methodologies corresponding to the completed stage by comparing the completed stage objective to a plurality of measured field data, and wherein the completed methodology grade comprises a weighting factor and a methodology value.

A sixteenth embodiment, which is the method of the fifteenth embodiment, further comprising validating, by the machine learning process, the completed methodology grade and corresponding completed stage by comparing the completed methodology grade to one or more prescribed methodologies within a database, and modifying the completed methodology grade in response to the completed methodology grade grading higher than the prescribed methodology.

A seventeenth embodiment, which is the method of any of the fifteenth and the sixteenth embodiments, further comprising saving the methodology grade and corresponding completed stage to a database.

An eighteenth embodiment, which is the method of any of the fifteenth through the seventeenth embodiments, further comprising training the machine learning process with supervised learning in response to the machine learning classifier recognizing the format of the completed cement placement procedure.

A nineteenth embodiment, which is a method of placing cement within a wellbore utilizing a historical database of wellbore construction, comprising retrieving, by a managing application executing on a computer system, a final cement placement procedure comprising a series of sequential stages to achieve a job objective, a plurality of customer wellbore data, and a plurality of stage objectives, and wherein each stage of the final cement placement procedure includes one or more prescribed methodologies, transporting a cement blend and a plurality of cement pumping equipment to a well site, wherein the cement blend is included in the final cement placement procedure, beginning the final cement placement procedure by the managing application, retrieving, by the managing application, one or more data sets of periodic pumping data indicative of the final cement placement procedure, beginning, by the managing application, a current stage of the final cement placement procedure, wherein the current stage is one of the stages of the final cement placement procedure, alerting, by the managing application, if the one or more prescribed methodology included in the current stage of the final cementing placement procedure is not found, determining, by the managing application, a probability of achieving the stage objective without the prescribed methodology based on machine learning process by accessing a database of methodologies for cement placement procedures, recommending, by the machine learning process, one or more prescribed methodologies to apply to one or more steps within the current stage or subsequent to the current stage of the final cement placement procedure to increase a probability score above a threshold value, and continuing the final cement placement procedure, by the managing application, in response to the probability score being above the threshold value for achieving the job objective.

A twentieth embodiment, which is the method of the nineteenth embodiment, wherein the wellbore data comprises wellbore diameter, casing size, casing thread type, pressure, temperature, formation geology, and wellbore trajectory.

A twenty-first embodiment, which is the method of the nineteenth embodiment, wherein the database is on the computer system, a local network, a local data source, or a remote data source; and wherein the remote data source is a server, a computer, a virtual computer, a virtual network function, or data storage device.

A twenty-second embodiment, which is the method of the nineteenth embodiment, wherein the job objective comprises a successful test of a barrier, wherein the barrier is a cement sheath disposed within an annulus formed between an outside of a casing disposed within the well and an inner wall of the wellbore.

A twenty-third embodiment, which is the method of the nineteenth embodiment, further comprising transporting a downhole tool to a well site, wherein the downhole tool is included in the cement placement procedure, beginning the cement placement procedure by the managing application, coupling the downhole tool with a casing via the cement placement procedure, retrieving, by the managing application, one or more data sets of periodic pumping data indicative of the cement placement procedure, alerting, by the managing application, if a prescribed methodology included in the cementing placement procedure is not found, calculating, by the managing application, the probability score of for achieving the job objective based on the machine learning process, recommending, by the machine learning process, one or more prescribed methodology to apply to one of more subsequent steps of the cement placement procedure to increase the probability score above a threshold value, and continuing the cement pumping procedure, by the managing application, in response to the probability score being above the threshold value for achieving the job objective.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method of cementing a wellbore penetrating a subterranean formation, comprising:
   receiving one or more customer inputs, by a design application executing on a computer system;
   initializing a design cement placement procedure, by the design application, by applying the customer inputs into a generic cement placement procedure;
   calculating, by the design application, a bill of materials and a cement equipment list from the design cement placement procedure, wherein the design application modifies at least one generic methodology to at least one design methodology with the bill of materials;
   generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies; and
   placing cement in the wellbore in accordance with the final cement placement procedure, wherein the placing of the cement in the wellbore comprises:
      transporting a cement blend and cement pumping equipment to a well site, wherein the cement blend is included in the final cement placement procedure;
      retrieving, by a managing application executing on the computer system, the final cement placement procedure;
      beginning the final cement placement procedure by the managing application; and
      continuing the final cement placement procedure, by the managing application, in response to the probability value being above a threshold value for achieving the job objective.

2. The method of claim 1, further comprising:
   retrieving the generic cement placement procedure, by the design application, from a database, wherein the generic cement placement procedure is a cement placement procedure comprising a series of sequential stages to achieve the job objective, wherein the stages comprise one or more steps with the at least one generic methodology, and wherein the stages and the at least one generic methodology are machine learning inputs.

3. The method of claim 2, further comprising:
   modifying, by the design application, the design cement placement procedure by inputting the bill of materials and one or more customer inputs into one or more wellbore construction models, wherein the wellbore construction models comprise a casing design model, casing stretch model, cement strength model, well control model, formation strength model, or dynamic loading model, wherein at least one wellbore construction model recommends modifying the bill of materials in response to a calculated design value being lower than a design threshold.

4. The method of claim 3, wherein:
   a machine learning process classifier identifies the at least one design methodology of the at least one stage of the design cement placement procedure;
   the machine learning process classifier determines a methodology grade for the design methodology within the database;
   the machine learning process classifier identifies a corresponding prescribed methodology within the database;
   wherein the machine learning process compares the methodology grade of the design methodology to the methodology grade of the corresponding prescribed methodology; and
   wherein the machine learning process retrieves the prescribed methodology in response to the prescribed methodology having a higher methodology grade.

5. The method of claim 4, further comprising:
   comparing, by the machine learning process, a first probability value for achieving a stage objective of at least one stage of the design cement placement procedure with at least one design methodology within at least one step of the stage to a second probability value for achieving the stage objective with a prescribed methodology, wherein the prescribed methodology is retrieved from the database, and wherein the prescribed methodology has a higher methodology grade than the design methodology; and
   replacing, by the machine learning process, the at least one design methodology within the at least one step of the stage with the prescribed methodology in response to the second probability value being greater than the first probability value for achieving the stage objective.

6. The method of claim 1, wherein:
   the one or more customer inputs comprise a plurality of wellbore data, a plurality of customer design inputs, and a job objective, and the customer design inputs comprise a bill of materials and one or more construction plans.

7. The method of claim 6, wherein:
   the wellbore data comprises a wellbore location, a wellbore history, and a plurality of sensor data, wherein the wellbore location comprises well names, a lease location, global positioning satellite (GPS) coordinates, an internal designation, or a combination thereof;
   the wellbore history comprises a wellbore survey, a wellbore drilling path, a wellbore production fluid analysis, a wellbore drilling fluid, and a wellbore construction history; and
   the plurality of sensor data comprises well logging, wellbore production sample, and well control data.

8. The method of claim 6, wherein:
   the job objective comprises wellbore isolation, a location of top of cement, a kick off plug, a shoe test, or a combination thereof.

9. The method of claim 1, further comprising:
   mixing a cement slurry, by the cement pumping equipment, according to the final cement placement procedure; and pumping the cement slurry according to the final cement placement procedure.

10. The method of claim 1, further comprising:
transporting a downhole tool to a well site, wherein the downhole tool is included in the final cement placement procedure; and
coupling the downhole tool to a casing according to the final cement placement procedure.

11. A method of cementing a wellbore, comprising:
retrieving, by a machine learning process executing on a computer system, a completed cement placement procedure;
identifying, by a machine learning classifier of the machine learning process, a format of the completed cement placement procedure, wherein the format comprises a job objective, a plurality of stages, a plurality of wellbore data, and a plurality of measured field data;
retrieving, by the machine learning classifier, the plurality of stages from the completed cement placement procedure;
producing, by the machine learning process, a combined methodology grade for each completed stage by comparing at least one completed stage of the plurality of stages to the plurality of measured field data corresponding to the completed stage, wherein the combined methodology grade comprises a plurality of completed methodologies within the completed stage;
validating, by the machine learning process, the combined methodology grade by comparing a predictive stage objective grade using the completed methodology grade to the completed stage objective grade to determine an error value, wherein the completed stage objective grade comprises the plurality of measured field data, a completed job objective grade, and a plurality of completed stage objective grades;
training the machine learning process to reduce the error value;
generating, by the machine learning process, a final cement placement procedure; and
placing cement in a wellbore in accordance with the final cement placement procedure, wherein the placing of the cement in the wellbore comprises:
transporting a cement blend and cement pumping equipment to a well site for a job, wherein the cement blend is included in the final cement placement procedure;
retrieving, by a managing application executing on the computer system, the final cement placement procedure;
beginning the final cement placement procedure by the managing application; and
continuing the final cement placement procedure, by the managing application, in response to a probability value being above a threshold value for achieving an objective of the job.

12. The method of claim 11, wherein:
the completed cement placement procedure comprises a series of sequential stages to achieve the job objective, and each completed stage of the cement placement procedure includes at least one completed methodology.

13. The method of claim 12, further comprising:
identifying, by the machine learning classifier, at least one completed methodology within a completed stage of the completed cement placement procedure by comparing a training set of training stages comprising training methodologies to the completed stage comprising the at least one completed methodology of the completed cement placement procedure, wherein the at least one completed methodology corresponding to the completed stage are inputs to the machine learning process.

14. The method of claim 13, further comprising:
grading, by the machine learning process, the at least one completed methodology corresponding to the completed stage by comparing the completed stage objective to a plurality of measured field data, wherein the completed methodology grade comprises a weighting factor and a methodology value.

15. The method of claim 14, further comprising:
validating, by the machine learning process, the completed methodology grade and the corresponding completed stage by comparing the completed methodology grade to one or more prescribed methodologies within a database, and modifying the completed methodology grade in response to the completed methodology grade being higher than the prescribed methodology.

16. The method of claim 14, further comprising:
saving the methodology grade and corresponding completed stage to the database.

17. The method of claim 14, further comprising:
training the machine learning process with supervised learning in response to the machine learning classifier recognizing the format of the completed cement placement procedure.

18. A method of placing cement within a wellbore utilizing a historical database of wellbore construction, comprising:
retrieving, by a managing application executing on a computer system, a final cement placement procedure comprising a series of sequential stages to achieve a job objective, a plurality of customer wellbore data, and a plurality of stage objectives, wherein each stage of the final cement placement procedure includes one or more prescribed methodologies;
transporting a cement blend and a plurality of cement pumping equipment to a well site, wherein the cement blend is included in the final cement placement procedure;
beginning the final cement placement procedure by the managing application;
retrieving, by the managing application, one or more data sets of periodic pumping data indicative of the final cement placement procedure;
beginning, by the managing application, a current stage of the final cement placement procedure, wherein the current stage is one of the stages of the final cement placement procedure;
generating an alert, by the managing application, in response to the one or more prescribed methodologies included in the current stage of the final cementing placement procedure not being found;
determining, by the managing application, a probability of achieving the stage objective without the prescribed methodologies based on a machine learning process by accessing a database of methodologies for cement placement procedures;
recommending, by the machine learning process, one or more prescribed methodologies to apply to one or more steps within the current stage or subsequent to the current stage of the final cement placement procedure to increase a probability score above a threshold value for achieving the job objective; and continuing the final cement placement procedure, by the managing application, in response to the probability score being above the threshold value for achieving the job objective.

19. The method of claim 18, wherein the wellbore data comprises wellbore diameter, casing size, casing thread type, pressure, temperature, formation geology, and wellbore trajectory.

20. The method of claim 18, wherein the database is on the computer system, a local network, a local data source, or a remote data source; and wherein the remote data source is a server, a computer, a virtual computer, a virtual network function, or data storage device.

21. The method of claim 18, wherein the job objective comprises a successful test of a barrier, wherein the barrier is a cement sheath disposed within an annulus formed between an outside of a casing disposed within the wellbore and an inner wall of the wellbore.

22. The method of claim 18, further comprising:
   transporting a downhole tool to a well site, wherein the downhole tool is included in the cement placement procedure;
   beginning the cement placement procedure by the managing application;
   coupling the downhole tool with a casing via the cement placement procedure;
   retrieving, by the managing application, one or more data sets of periodic pumping data indicative of the cement placement procedure;
   generating an alert, by the managing application, in response to a prescribed methodology included in the cementing placement procedure not being found;
   calculating, by the managing application, the probability score for achieving the job objective based on the machine learning process;
   recommending, by the machine learning process, one or more prescribed methodologies to apply to one of more subsequent steps of the cement placement procedure to increase the probability score above a threshold value; and
   continuing the cement pumping procedure, by the managing application, in response to the probability score being above the threshold value for achieving the job objective.

23. A method of cementing a wellbore penetrating a subterranean formation, comprising:
   receiving one or more customer inputs, by a design application executing on a computer system, wherein the one or more customer inputs comprise a plurality of wellbore data, a plurality of customer design inputs, and a job objective, and wherein the customer design inputs comprise a bill of materials and one or more construction plans;
   initializing a design cement placement procedure, by the design application, by applying the customer inputs into a generic cement placement procedure;
   generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies; and
   placing cement in the wellbore in accordance with the final cement placement procedure.

24. A method of cementing a wellbore penetrating a subterranean formation, comprising:
   receiving one or more customer inputs, by a design application executing on a computer system;
   initializing a design cement placement procedure, by the design application, by applying the customer inputs into a generic cement placement procedure;
   generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies;
   placing cement in the wellbore in accordance with the final cement placement procedure;
   transporting a cement blend and a plurality of cement pumping equipment to a well site, wherein the cement blend is included in the cement placement procedure;
   beginning the cement placement procedure by the design application;
   retrieving, by the design application, one or more data sets of periodic pumping data indicative of the cement placement procedure;
   mixing a cement slurry, by the cement pumping equipment, per the cement placement procedure;
   pumping the cement slurry per the cement placement procedure;
   generating an alert, by the design application, in response to the prescribed methodology included in the cementing placement procedure not being found;
   calculating, by the machine learning process, a probability score for achieving the job objective based on a probability model;
   recommending, by the machine learning process, one or more prescribed methodology to apply to one or more subsequent steps of the cement placement procedure to increase the probability score above a threshold value; and
   continuing the cement placement procedure, by the design application, in response to the probability score being above the threshold value for achieving the job objective.

25. A method of cementing a wellbore penetrating a subterranean formation, comprising:
   receiving one or more customer inputs, by a design application executing on a computer system;
   initializing a design cement placement procedure, by the design application, by applying the customer inputs into a generic cement placement procedure;
   generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies;
   placing cement in the wellbore in accordance with the final cement placement procedure;

transporting a downhole tool to a well site, wherein the downhole tool is included in the cement placement procedure;

beginning the cement placement procedure by the design application;

coupling the downhole tool with a casing via the cement placement procedure;

retrieving, by the design application, one or more data sets of periodic pumping data indicative of the cement placement procedure;

generating an alert, by the design application, in response to a prescribed methodology included in the cementing placement procedure not being found;

calculating, by the machine learning process, a probability score of for achieving the job objective based on a probability model;

recommending, by the machine learning process, one or more prescribed methodologies to apply to one of more subsequent steps of the cement placement procedure to increase the probability score above a threshold value; and continuing the cement placement procedure, by the design application, in response to the probability score being above the threshold value for achieving the job objective.

26. A method of cementing a wellbore penetrating a subterranean formation, comprising:

receiving one or more customer inputs, by a design application executing on a computer system;

retrieving a generic cement placement procedure, by the design application, from a database, wherein the generic cement placement procedure is a cement placement procedure comprising a series of sequential stages to achieve the job objective, wherein the stages comprise one or more steps with the at least one generic methodology, and wherein the stages and the at least one generic methodology are machine learning inputs;

initializing the design cement placement procedure, by the design application, by applying the customer inputs into a generic cement placement procedure;

calculating, by the design application, a bill of materials and a cement equipment list from the design cement placement procedure, wherein the design application modifies at least one generic methodology to at least one design methodology with the bill of materials; and generating, by a machine learning process, a final cement placement procedure by modifying the design cement placement procedure with one or more prescribed methodologies in response to a probability value for the design cement placement procedure achieving a job objective with the one or more prescribed methodologies being greater than the probability value for the design cement placement procedure achieving a job objective without the one or more prescribed methodologies.

27. A method of cementing a wellbore, comprising:

retrieving, by a machine learning process executing on a computer system, a completed cement placement procedure, wherein the completed cement placement procedure comprises a series of sequential stages to achieve the job objective, and each completed stage of the cement placement procedure includes at least one completed methodology;

identifying, by a machine learning classifier of the machine learning process, a format of the completed cement placement procedure, wherein the format comprises a job objective, a plurality of stages, a plurality of wellbore data, and a plurality of measured field data;

retrieving, by the machine learning classifier, the plurality of stages from the completed cement placement procedure;

producing, by the machine learning process, a combined methodology grade for each completed stage by comparing at least one completed stage of the plurality of stages to the plurality of measured field data corresponding to the completed stage, wherein the combined methodology grade comprises a plurality of completed methodologies within the completed stage;

validating, by the machine learning process, the combined methodology grade by comparing a predictive stage objective grade using the completed methodology grade to the completed stage objective grade to determine an error value, wherein the completed stage objective grade comprises the plurality of measured field data, a completed job objective grade, and a plurality of completed stage objective grades;

training the machine learning process to reduce the error value;

generating, by the machine learning process, a final cement placement procedure; and placing cement in a wellbore in accordance with the final cement placement procedure.

\* \* \* \* \*